(12) United States Patent
Brewer et al.

(10) Patent No.: US 11,540,399 B1
(45) Date of Patent: Dec. 27, 2022

(54) SYSTEM AND METHOD FOR BONDING A CABLE TO A SUBSTRATE USING A DIE BONDER

(71) Applicant: HRL LABORATORIES, LLC, Malibu, CA (US)

(72) Inventors: Peter Brewer, Westlake Village, CA (US); Aurelio Lopez, Malibu, CA (US); Pamela R. Patterson, Los Angeles, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 170 days.

(21) Appl. No.: 17/167,955

(22) Filed: Feb. 4, 2021

Related U.S. Application Data

(60) Provisional application No. 63/007,484, filed on Apr. 9, 2020.

(51) Int. Cl.
*B23K 1/00* (2006.01)
*H05K 3/34* (2006.01)
(Continued)

(52) U.S. Cl.
CPC ......... *H05K 3/3431* (2013.01); *B23K 1/0016* (2013.01); *B23K 3/00* (2013.01);
(Continued)

(58) Field of Classification Search
CPC .......... H05K 3/3431; H05K 2203/163; H05K 2203/166; B23K 1/0016; B23K 2101/42;
(Continued)

(56) References Cited

U.S. PATENT DOCUMENTS 5,516,023 A * 5/1996 Kono ............... H01L 24/78
228/9
5,699,951 A * 12/1997 Miyoshi ........... H01L 24/85
228/55

(Continued)

FOREIGN PATENT DOCUMENTS

WO   WO-2009108202 A1 *  9/2009   ......... B23K 20/004

OTHER PUBLICATIONS

SET FC300: The Submicron Die Bonder and Flip Chip Bonder for 3D IC, Adhesive Bonding, https://web.archive.org/web/20170517115123/http://www.set-sas.fr:80/en/pp422407-421389-FC300.html, last accessed Feb. 4, 2021, 3 pages.

*Primary Examiner* — Kiley S Stoner
(74) *Attorney, Agent, or Firm* — Lewis, Roca Rothgerber Christie LLP

(57) ABSTRACT

A method of bonding a double-ended cable to a multi-tier substrate (such as a multi-tier printed circuit board) includes picking up the double-ended cable, and imaging alignment markers on a first head of the double-ended cable, a second substrate of the multi-tier substrate, a second head of the double-ended cable, and a first substrate of the multi-tier substrate. The method also includes aligning the alignment marker on the first head of the cable to the alignment marker on the second substrate of the multi-tier substrate, coupling the first head of the cable to the second substrate, and releasing the first head of the cable. The method further includes aligning the alignment marker on the second head of the cable to the alignment marker on the first substrate of the multi-tier substrate, coupling the second head of the cable to the first substrate, and releasing the second head of the cable.

20 Claims, 19 Drawing Sheets

(51) Int. Cl.
*B23K 3/00* (2006.01)
*B23K 101/42* (2006.01)

(52) U.S. Cl.
CPC .... *B23K 2101/42* (2018.08); *H05K 2203/163* (2013.01); *H05K 2203/166* (2013.01)

(58) Field of Classification Search
CPC .. B23K 20/004; B23K 20/005; B23K 20/007; B23K 24/85; B23K 24/86; B23K 1/00–206; B23K 3/00–087
USPC ... 228/4.5, 180.2, 904, 102–103, 105, 8–12, 228/6.2
See application file for complete search history.

(56) References Cited

U.S. PATENT DOCUMENTS

| | | | | |
|---|---|---|---|---|
| 6,449,516 | B1* | 9/2002 | Kyomasu | B23Q 15/22 700/59 |
| 6,820,792 | B2* | 11/2004 | Kim | H01L 21/67144 228/49.5 |
| 8,991,681 | B2* | 3/2015 | Maki | H01L 21/00 228/123.1 |
| 2001/0011669 | A1* | 8/2001 | Hayata | H01L 24/78 228/103 |
| 2001/0013532 | A1* | 8/2001 | Higashi | H01L 24/78 228/49.1 |
| 2001/0016786 | A1* | 8/2001 | Takahashi | B23K 20/10 700/192 |
| 2001/0042770 | A1* | 11/2001 | Hayata | H01L 24/78 228/4.1 |
| 2002/0104870 | A1* | 8/2002 | Nogawa | B23K 20/004 228/180.5 |
| 2004/0060663 | A1* | 4/2004 | Haraguchi | B23K 20/005 382/145 |
| 2005/0061852 | A1* | 3/2005 | Behler | H01L 24/78 228/102 |
| 2005/0167471 | A1* | 8/2005 | Enokido | B23K 20/004 228/103 |
| 2008/0223612 | A1* | 9/2008 | Muramatsu | H05K 1/0269 29/846 |
| 2008/0259352 | A1* | 10/2008 | Sugawara | H01L 24/85 356/601 |
| 2012/0024089 | A1* | 2/2012 | Couey | H01L 24/85 228/102 |
| 2012/0214258 | A1* | 8/2012 | Kihara | H01L 21/67144 228/49.1 |
| 2014/0283380 | A1* | 9/2014 | Hiroshima | H05K 13/046 294/185 |
| 2015/0155254 | A1* | 6/2015 | Schmidt-Lange | H01L 24/75 228/104 |
| 2020/0068719 | A1* | 2/2020 | Bando | H05K 13/0413 |
| 2021/0202432 | A1* | 7/2021 | Yuzawa | H01L 23/49575 |
| 2021/0296268 | A1* | 9/2021 | Braganca, Jr. | H01L 23/544 |

* cited by examiner

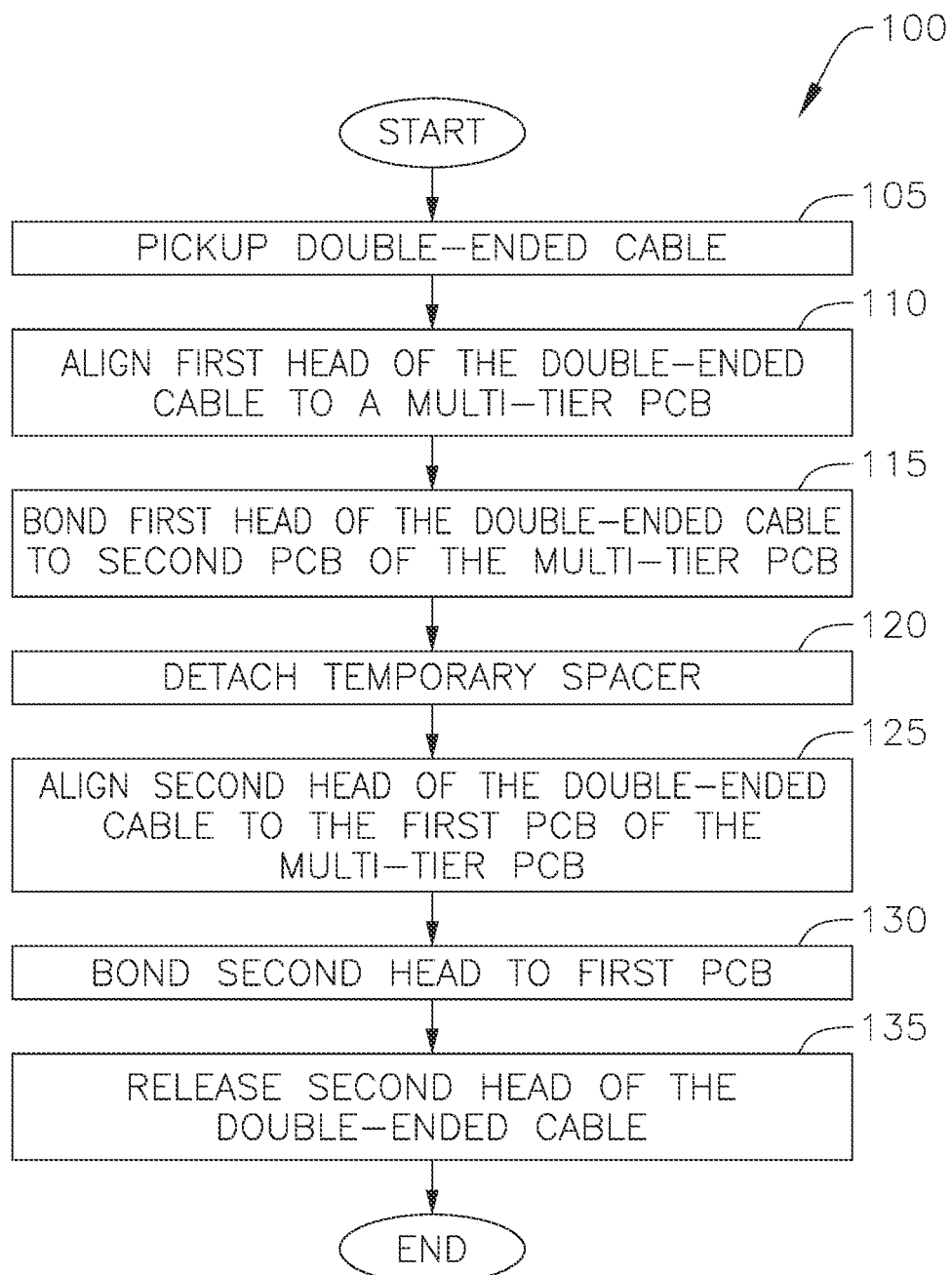

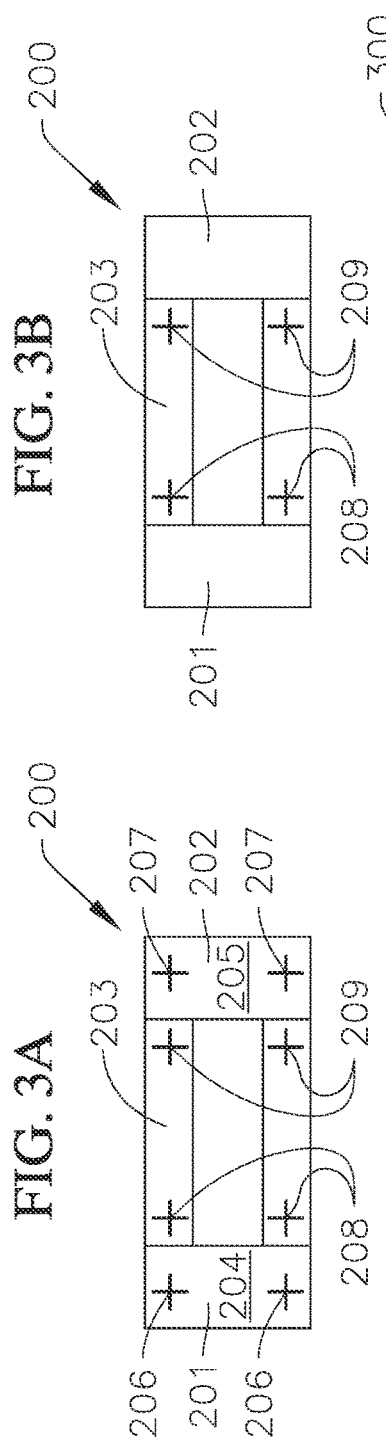
FIG. 3A
FIG. 3B
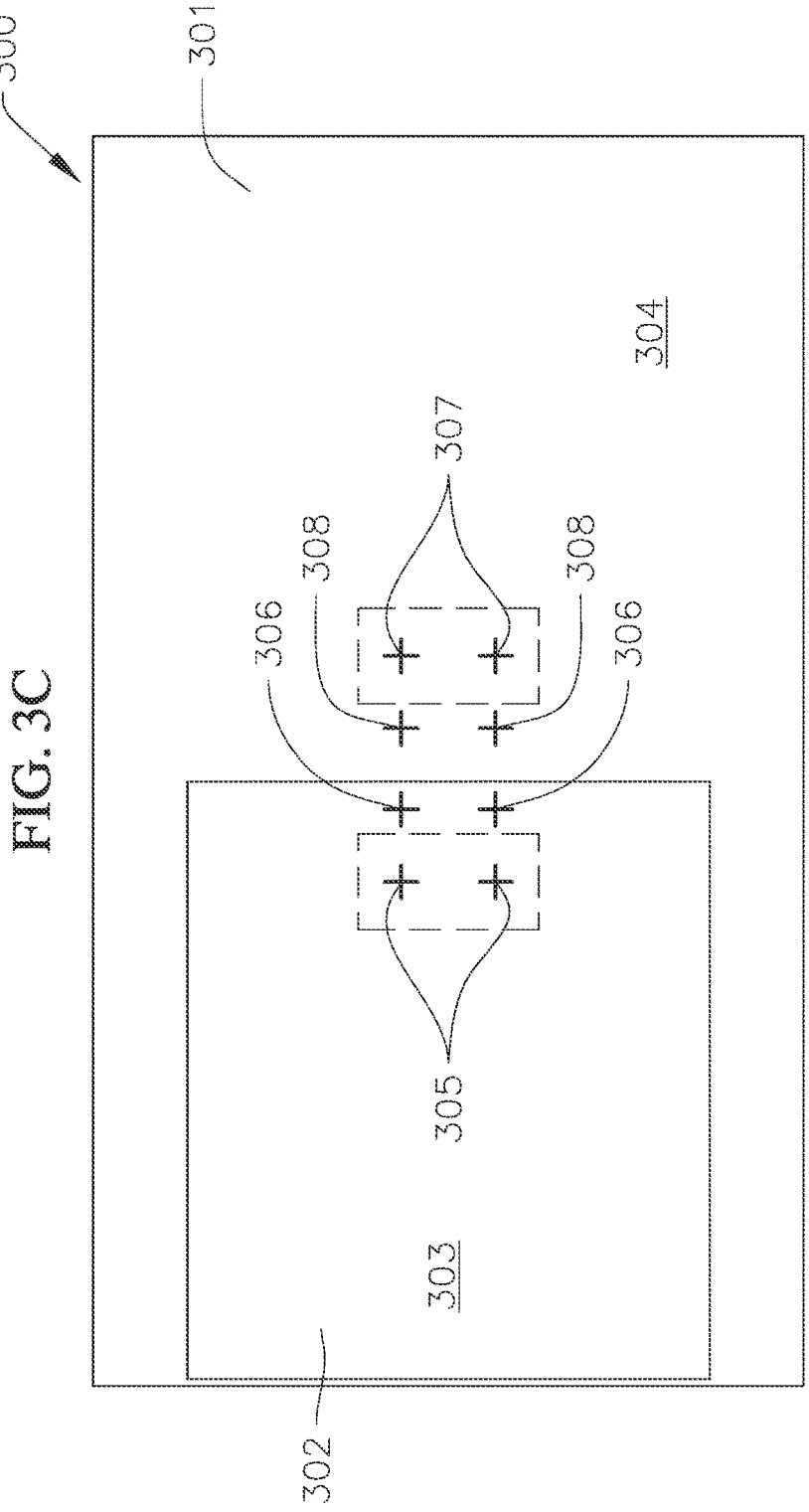
FIG. 3C

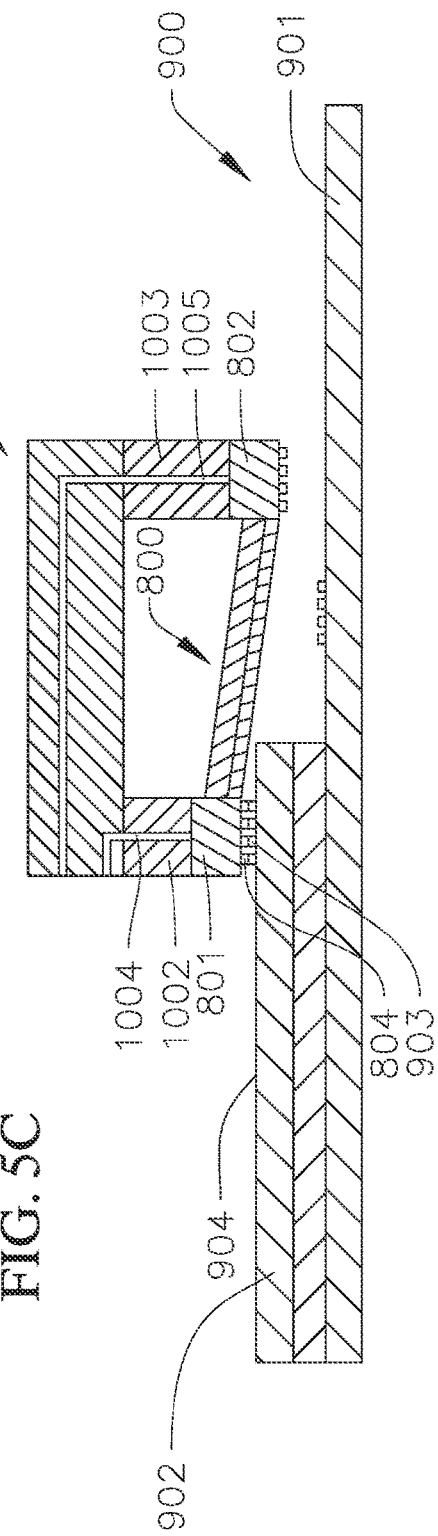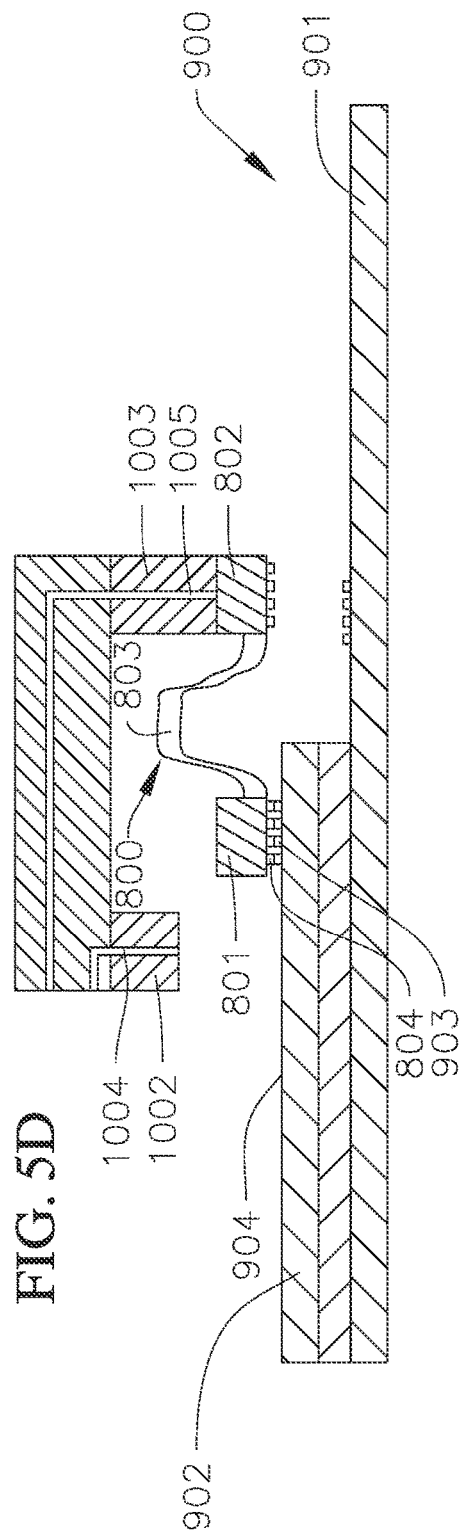

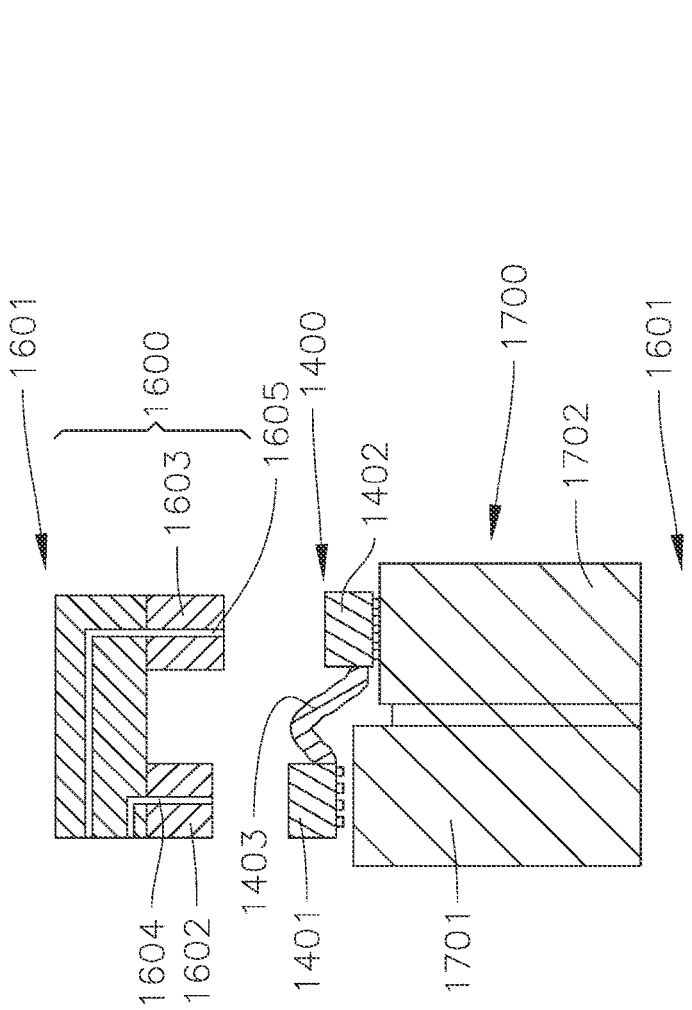
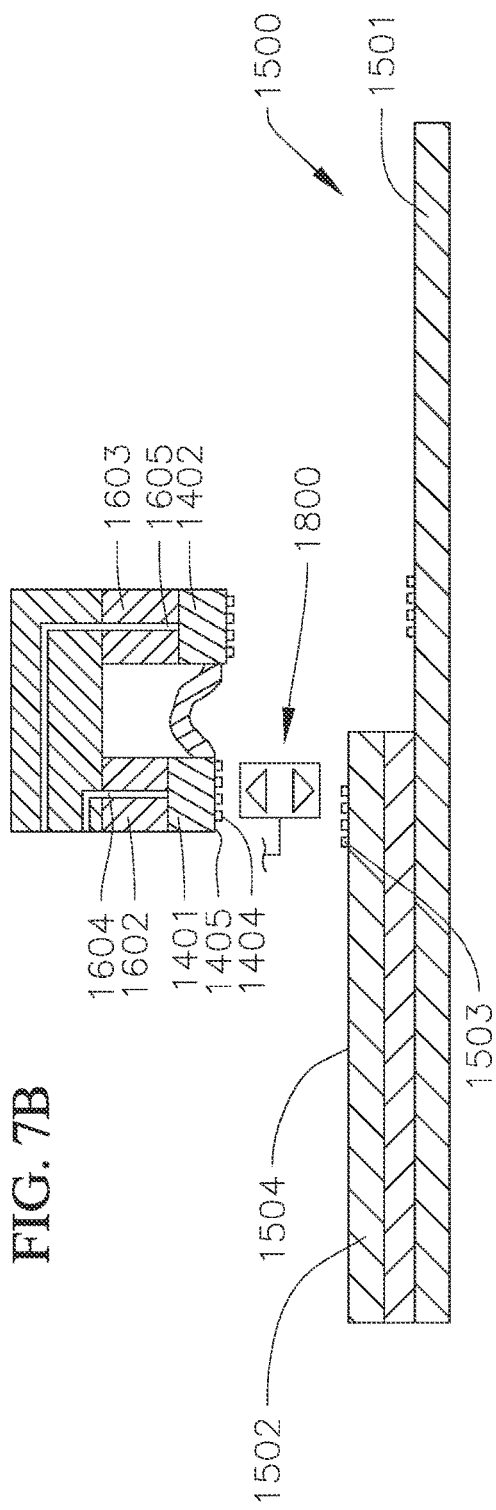
FIG. 7A
FIG. 7B

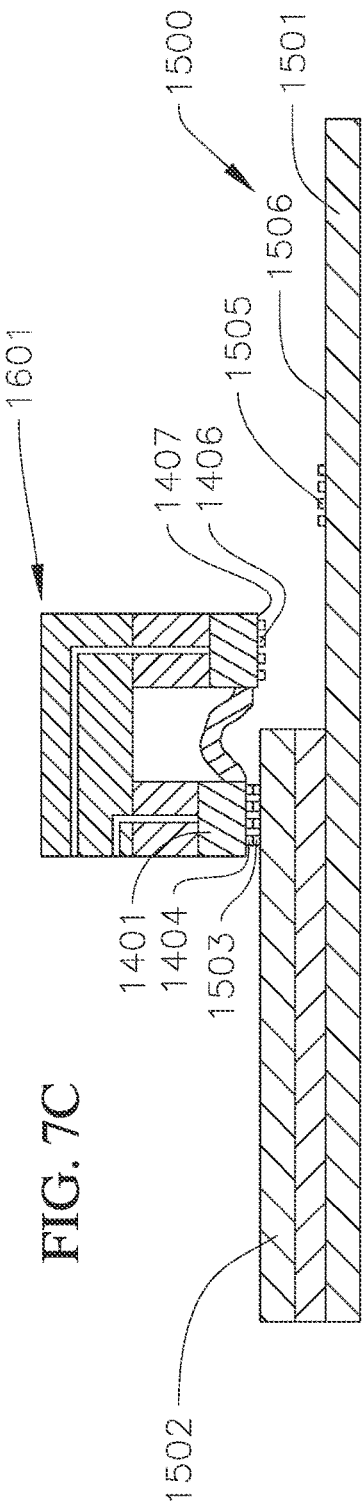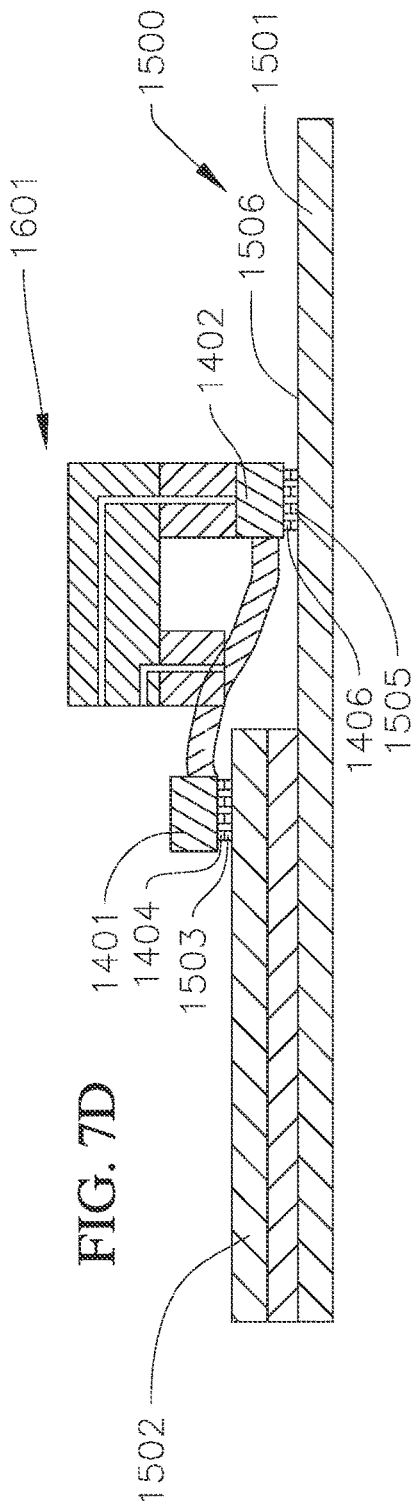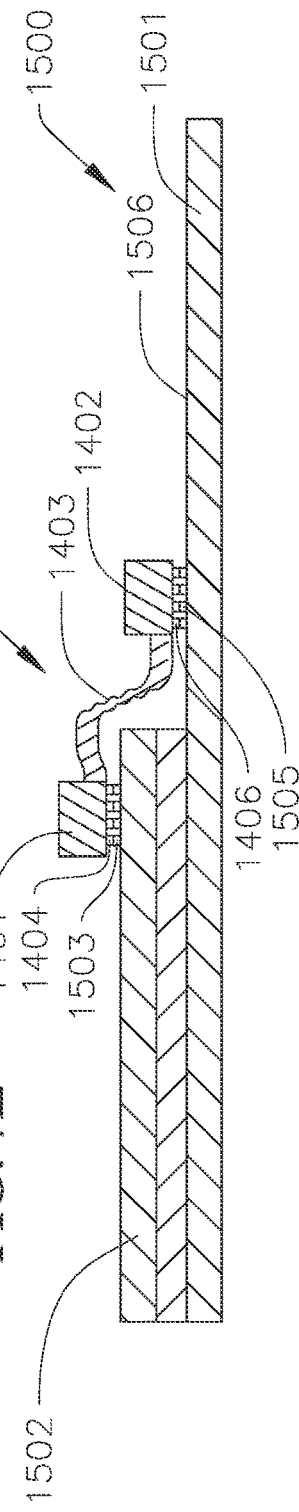

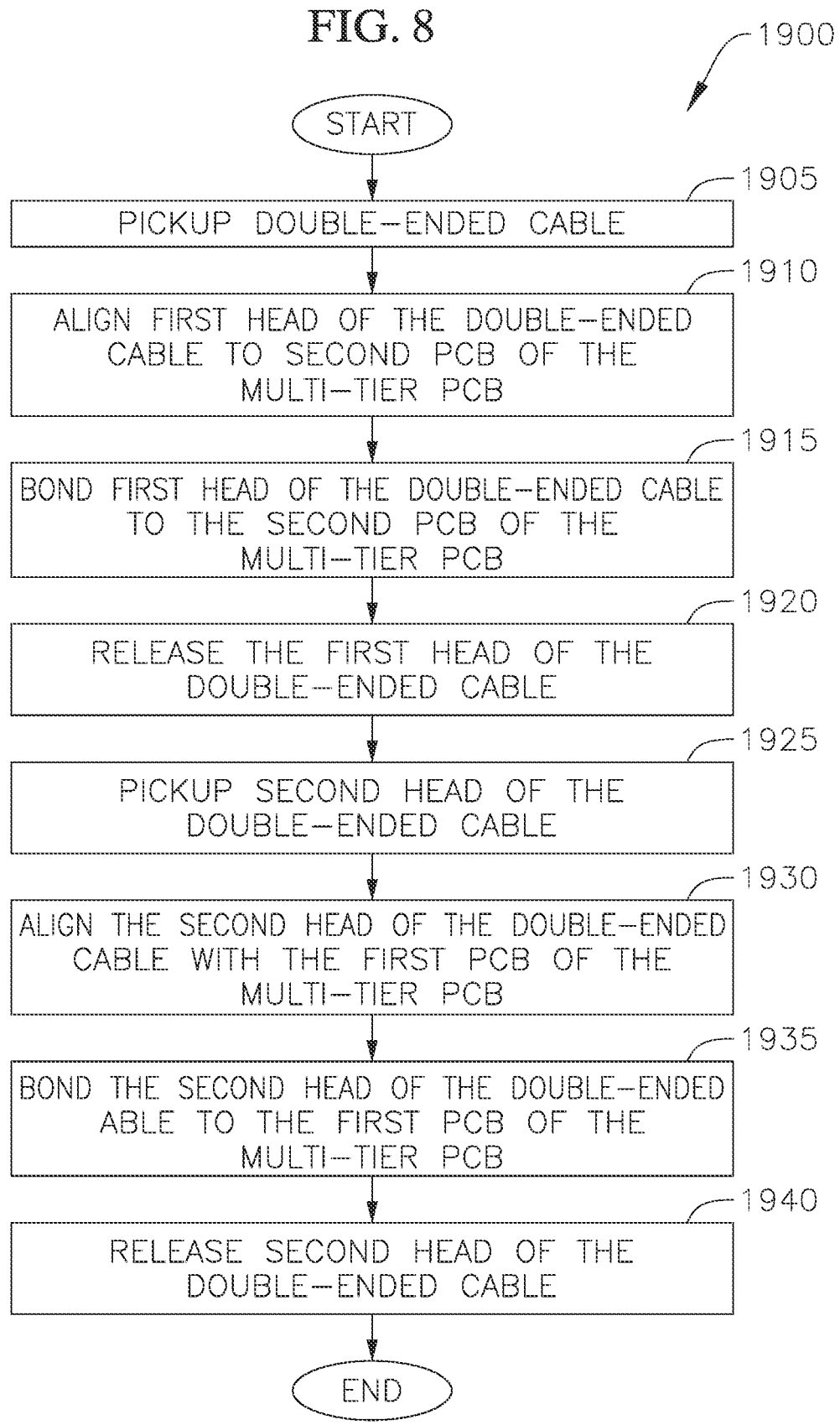

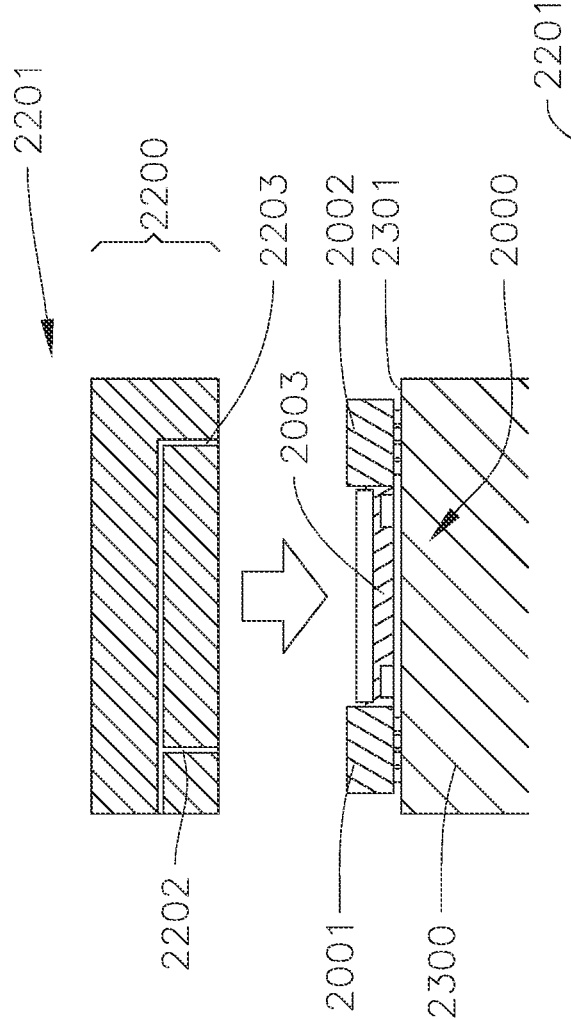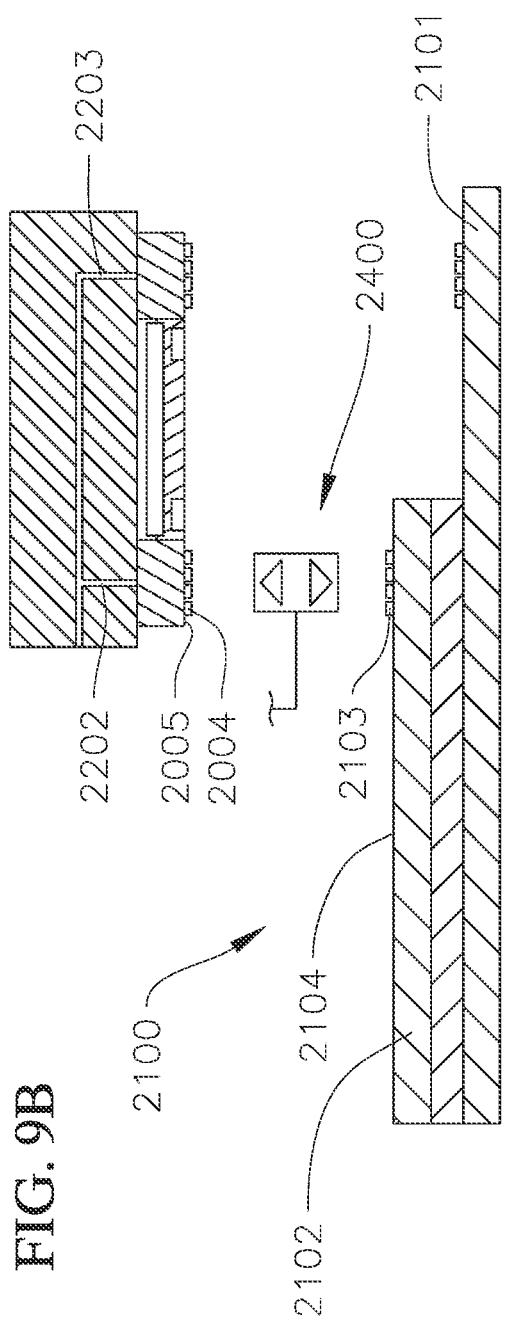
FIG. 9A
FIG. 9B

SYSTEM AND METHOD FOR BONDING A CABLE TO A SUBSTRATE USING A DIE BONDER

CROSS-REFERENCE TO RELATED APPLICATION(S)

The present application claims priority to and the benefit of U.S. Provisional Patent Application No. 63/007,484, filed Apr. 9, 2020, the entire content of which is incorporated herein by reference.

STATEMENT REGARDING FEDERALLY SPONSORED RESEARCH OR DEVELOPMENT

This invention was made with U.S. Government support. The U.S. Government has certain rights to this invention.

BACKGROUND

1. Field

The present disclosure relates generally to systems and methods of bonding a cable to a substrate utilizing a die bonder.

2. Description of Related Art

Multi-ended electronic devices, such as cables, are commonly utilized to electrically connect two or more host substrates (e.g., host electronics, such as chips, printed circuit boards (PCBs), packages) together. The multi-ended devices are typically connected to the host substrates by thermosonic bonding and/or a reflow solder process. However, while precision die bonders exist in the semiconductor and packaging industries for interconnecting semiconductor devices and sockets and pin-header terminated cables with pitches as fine as 300 µm, there are no systems or methods in the related art for assembling cables onto host electronics with finer pitches.

SUMMARY

The present application relates to various embodiments of a method of bonding a double-ended cable, including a first head, a second head, and a ribbon cable between the first head and the second head, to a multi-tier substrate (such as a multi-tier printed circuit board (PCB)), including a first substrate (such as a first PCB) and a second substrate (such as a second PCB) stacked on the first substrate. In one embodiment, the method includes picking up, with a top bonder arm of a die bonder system, the double-ended cable, and imaging, with an optical system, at least one alignment marker on the first head of the double-ended cable, at least one alignment marker on the second substrate of the multi-tier substrate, at least one alignment marker on the second head of the double-ended cable, and at least one alignment marker on the first substrate of the multi-tier substrate. The method also includes aligning, with the top bonder arm, the alignment marker on the first head of the double-ended cable to the alignment marker on the second substrate of the multi-tier substrate within a first alignment error, coupling the first head of the double-ended cable to the second substrate and releasing the first head of the double-ended cable from the top bonder arm. The method also includes aligning, with the top bonder arm, the alignment marker on the second head of the double-ended cable to the alignment marker on the first substrate of the multi-tier substrate within a second alignment error, coupling the second head of the double-ended cable to the first substrate, and releasing the second head of the double-ended cable from the top bonder arm.

The first alignment error may be approximately 1 µm or less, and the second alignment error may be approximately 2 µm or less.

The top bonder arm may include a first end effector and a second end effector.

The top bonder arm may include a temporary spacer on the first end effector, and the method may include detaching the temporary spacer from the first end effector before coupling the second head of the double-ended cable to the first substrate.

A height of the first end effector may be substantially equal to a height of the second end effector, and the task of picking up the double-ended cable may include picking up the double-ended cable in a planar configuration from a planar support surface.

The first end effector may be shorter than the second end effector, and the task of picking up the double-ended cable may include picking up the double-ended cable in a non-planar configuration from a non-planar support surface.

A lateral spacing between the first end effector and the second end effector may be substantially equal to a length of the ribbon cable in an extended configuration.

A lateral spacing between the first end effector and the second end effector may be less than a length of the ribbon cable in an extended configuration.

The imaging may include superimposing an image of the at least one alignment marker on the first head of the double-ended cable on an image of the at least one alignment marker on the second substrate of the multi-tier substrate.

The imaging may include imaging a pair of alignment markers on a lower surface of the first head, imaging a pair of alignment marks on a portion of the ribbon cable proximate to the first head, imaging a first pair and a second pair of alignment markers on an upper surface of the second substrate, imaging a pair of alignment markers on a lower surface of the second head, imaging a pair of alignment marks on a portion of the ribbon cable proximate to the second head, and imaging a first pair and a second pair of alignment markers on an upper surface of the first substrate.

The present disclosure also relates to various embodiments of a system for bonding a double-ended cable, including a first head, a second head, and a ribbon cable between the first head and the second head, to a multi-tier substrate (such as a multi-tier printed circuit board (PCB)), including a first substrate (such as a first PCB) and a second substrate (such as a second PCB) stacked on the first substrate. In one embodiment, the system includes a carrier having a support surface configured to support the double-ended cable, a top bonder arm of a die bonder system including a first end effector configured to lift the first head and a second end effector configured to lift the second head of the double-ended cable, and an optical system configured to image at least one alignment marker on the first head of the double-ended cable, at least one alignment marker on the second substrate of the multi-tier substrate, at least one alignment marker on the second head of the double-ended cable, and at least one alignment marker on a first substrate of the multi-tier substrate.

The top bonder arm may include a temporary spacer detachably coupled to the first end effector.

The top bonder arm may include a first vacuum port in the first end effector, a second vacuum port in the first end effector, a third vacuum port in the second end effector, and a fourth vacuum port in the temporary spacer that is aligned with the first vacuum port in the first end effector.

A height of the first end effector may be substantially equal to a height of the second end effector, and the support surface may be planar.

The first end effector may be shorter in length than the second end effector, and the support surface may be non-planar.

A lateral spacing between the first end effector and the second end effector may be substantially equal to a length of the ribbon cable in an extended configuration.

A lateral spacing between the first end effector and the second end effector may be less than a length of the ribbon cable in an extended configuration.

The optical system may include a dual view microscope.

According to another embodiment of the present disclosure, the method includes picking up, with a first top bonder arm of a die bonder system, the double-ended cable, imaging, with an optical system, at least one alignment marker on the first head of the double-ended cable and at least one alignment marker on the second substrate of the multi-tier substrate, aligning, with the first top bonder arm, the alignment marker on the first head of the double-ended cable to the alignment marker on the second substrate of the multi-tier substrate, coupling the first head of the double-ended cable to the second substrate, and releasing the first head of the double-ended cable from the first top bonder arm. The method also includes imaging, with the optical system, at least one alignment marker on a second top bonder arm of the die bonder system, at least one alignment marker on the second head of the double-ended cable, and at least one alignment marker on the first substrate of the multi-tier substrate after the coupling of the first head of the double-ended cable to the second substrate, picking up, with the second top bonder arm of the die bonder system, the second head of the double-ended cable, aligning, with the second top bonder arm of the die bonder system, the alignment marker on the second head of the double-ended cable to the alignment marker on the first substrate of the multi-tier substrate, coupling the second head of the double-ended cable to the first substrate, and releasing the second head of the double-ended cable from the second top bonder arm.

The method may include temporarily coupling the second head of the double-ended cable to the first substrate with a vacuum wand or temporary adhesive.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIG. 1 is a flowchart depicting tasks of a method of bonding a cable to a substrate according to one embodiment of the present disclosure;

FIGS. 3A-3B are a bottom view and a top view, respectively, of alignment markers on a double-ended cable according to one embodiment of the present disclosure;

FIG. 3C is a top view of alignment markers on a first PCB and a second PCB of a multi-tier PCB according to one embodiment of the present disclosure;

FIGS. 5A-5F depict a die bonder system according to one embodiment of the present disclosure performing various tasks illustrated in FIG. 4 for bonding the cable to the substrate;

FIGS. 7A-7E depict a die bonder system according to one embodiment of the present disclosure performing various tasks illustrated in FIG. 6 for bonding the cable to the substrate;

FIG. 8 is a flowchart depicting tasks of a method of bonding a cable to a substrate according to one embodiment of the present disclosure; and FIGS. 9A-9E depict a die bonder system according to one embodiment of the present disclosure performing various tasks illustrated in FIG. 8 for bonding the cable to the substrate.

DETAILED DESCRIPTION

Figure 2A:
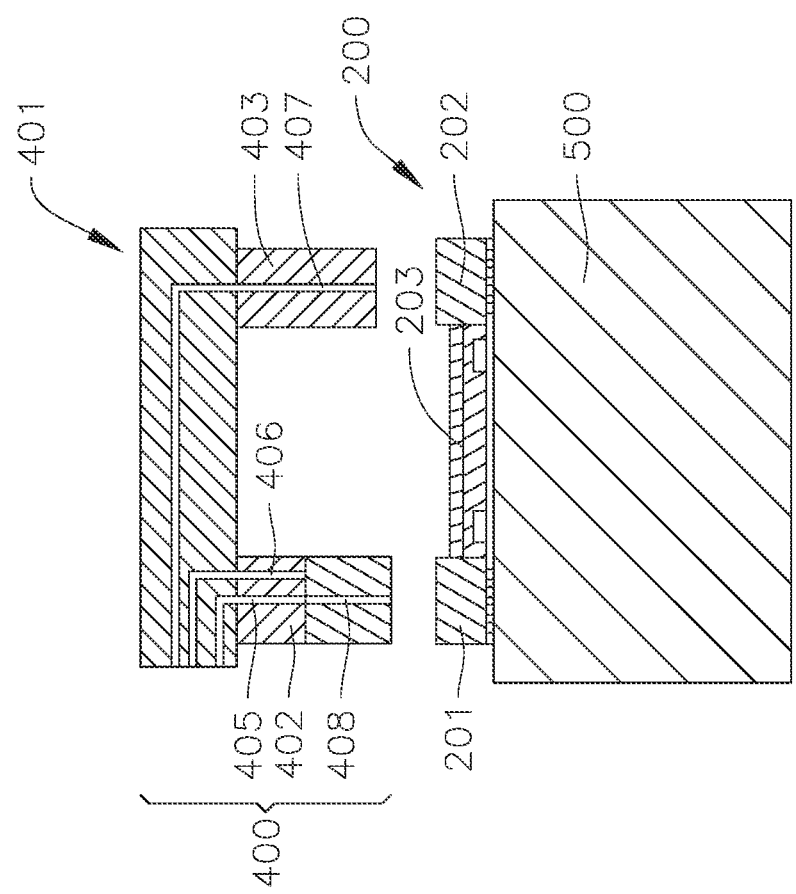
FIGS. 2A-2K depict a die bonder system according to one embodiment of the present disclosure performing various tasks illustrated in FIG. 1 for bonding the cable to the substrate.

Aspects of the present disclosure relate to various embodiments of a system and a method for bonding multi-ended devices (e.g., cables) to host substrates (e.g., chips, printed circuit boards (PCBs), packages) with high precision, such as micron-level alignment accuracy and precision. In one or more embodiments, the systems and methods of the present disclosure are configured to align and attach a first end of a double-ended cable to a multi-tier substrate (such as a PCB stack) within a positional accuracy of approximately (about) 1 µm or less, and the systems and methods of the present disclosure are configured to align and attach a second end of the double-ended cable to the multi-tier substrate (e.g., the PCB stack) with a positional accuracy of approximately (about) 2 µm. Additionally, in one or more embodiments, the systems and methods of the present disclosure may be utilized to align and bond a cable to a multi-tier substrate with high accuracy and precision (e.g., the systems and methods of the present disclosure may be utilized to align and attach the ends of a cable to a substrate at different heights). In general, it is difficult to align the second end of the cable to the PCB stack after the first end of the cable has been bonded to the PCB stack because the optics of the precision die bonder (which may be utilized to measure alignment or misalignment) cannot be inserted between the second end of the cable and the PCB stack after the first end of the cable has been bonded to the PCB stack because of the limitations of the overall length of the cable (which is typically designed for a minimal length between the first and second ends) and because of the relatively large size of the optics needed to inspect the cable and the PCB stack with high resolution (e.g., sub-micron accuracy). Embodiments of the present disclosure overcome these obstacles by either aligning the second end of the cable to the PCB stack before the first end of the cable is bonded to the PCB stack, or by aligning the second end of the cable to the PCB stack after the first end of the cable is bonded to the PCB stack by inserting the optics between the bond tool and the second end of the cable, rather than between the second end of the cable and the PCB stack.

FIG. 1 is a flowchart illustrating tasks of a method 100 of bonding a double-ended cable 200 (which includes a first head 201, a second head 202, and ribbon cables (which may comprise or be formed of polyamide, PVC, or silicon rubber) 203 extending between the first and second heads 201, 202) to a multi-tier PCB 300 according to one embodiment of the present disclosure (e.g., bonding the second head 202 of the double-ended cable 200 to a first PCB 301 of the multi-tier PCB 300 and bonding the first head 201 of the double-ended cable 200 to a second PCB 302 of the multi-tier PCB 300, wherein the second PCB 302 is stacked on the first PCB 301). FIGS. 2A-2K depict a die bonder system 400 according to one embodiment of the present disclosure performing various tasks illustrated in FIG. 1 for bonding the double-ended cable 200 to the multi-tier PCB 300.

With reference now to the embodiment illustrated in FIGS. 1 and 2A, the method 100 includes a task 105 of picking up the double-ended cable 200 utilizing a top bonder arm 401 of the die bonder system 400. In the illustrated embodiment, the top bonder arm 401 includes a first end effector 402 and a second end effector 403. In the illustrated embodiment, the end effectors 402 and 403 are configured to move together in the x-, y-, and/or z-directions, although in one or more embodiments, the end effectors 402 and 403 may be configured to move independently in the x-, y-, and/or z-directions. In the illustrated embodiment, the first end effector 402 is shorter than the second end effector 403 (i.e., a height of the first end effector 402 is less than a height of the second end effector 403). Additionally, in the illustrated embodiment, a temporary spacer 404 is provided on the first end effector 402, and a total combined height of the first end effector 402 and the temporary spacer 404 is equal or substantially equal to the height of the second end effector 403. Moreover, in the illustrated embodiment, the lateral distance or lateral spacing between the first end effector 402 and the second end effector 403 is equal or substantially equal to a length of the ribbon cable 203 between a first head 201 and a second head 202 of the double-ended cable 200. Accordingly, during the task 105 of picking up the double-ended cable 200, the double-ended cable 200 is elongated or taut between the temporary spacer 404 and the second end effector 403. Additionally, in the illustrated embodiment, the task 105 of picking up the double-ended cable 200 includes picking up the double-ended cable 200 while the double-ended cable 200 is lying flat (e.g., planar) on a flat (e.g., planar) support surface 500.

In the illustrated embodiment, the top bonder arm 401 includes first and second vacuum ports 405, 406 in the first end effector 402, and a third vacuum port 407 in the second end effector 403. A fourth vacuum port 408 is provided in the temporary spacer 404. When the temporary spacer 404 is on the first end effector 402, the fourth vacuum port 408 in the temporary spacer 404 is aligned or substantially aligned with the first vacuum port 405 in the first end effector 402. In one or more embodiments, the first, second, and third vacuum ports 405, 406, 407 are independently controllable. In the illustrated embodiment, the task 105 of picking up the double-ended cable 200 includes lowering the top bonder arm 401 of the die bonder system 400 until the temporary spacer 404 is in contact with or in close proximity to a first head 201 of the double-ended cable 200, and the second end effector 403 is in contact with or in close proximity to the second head 202 of the double-ended cable 200. Furthermore, the task 105 includes activating the first vacuum port 405 and the third vacuum port 407. In the illustrated embodiment, activating the first vacuum port 405 activates the fourth vacuum port 408 in the temporary spacer 404. Accordingly, activating the first and third vacuum ports 405, 407 causes the first head 201 of the double-ended cable 200 to be suctioned to the temporary spacer 404 and causes the second head 202 of the double-ended cable 200 to be suctioned to the second end effector 403. In one or more embodiments, the temporary spacer 404 may be temporarily connected to the first end effector 402 by activating the second vacuum port 406 in the first end effector 402.

Figure 2B:
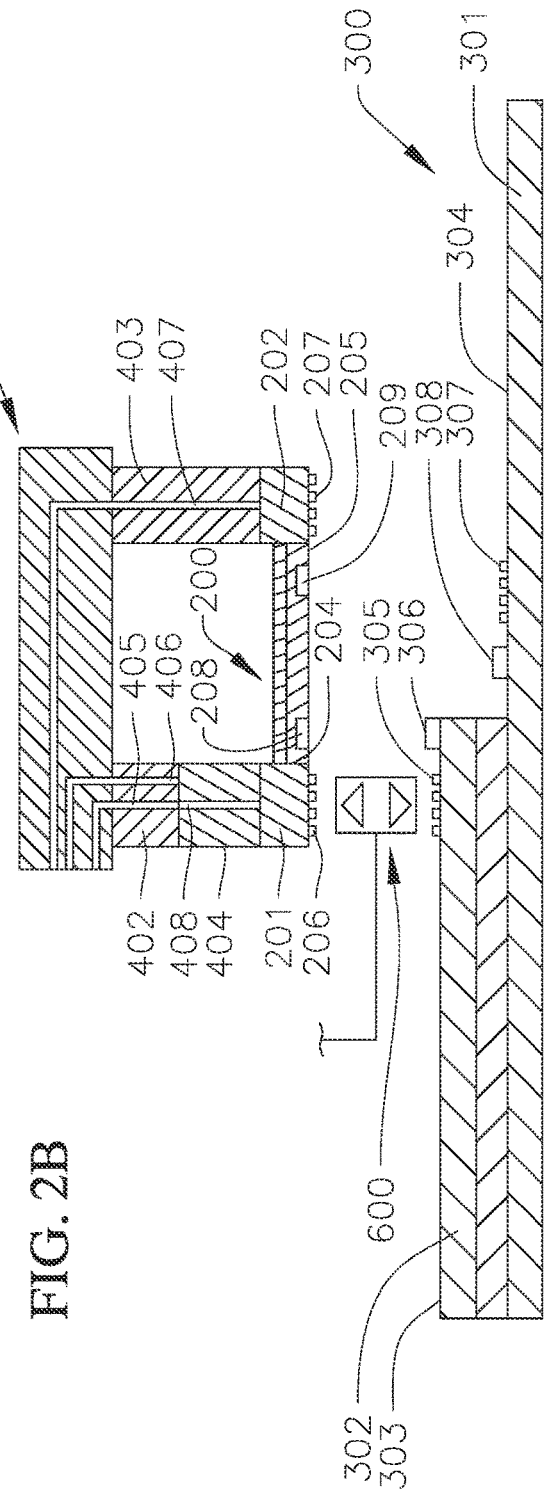

With reference now to the embodiment illustrated in FIGS. 1 and 2B, the method 100 also includes a task 110 of aligning the first head 201 of the double-ended cable 200 to the second PCB 302 of the multi-tier PCB 300. In one or more embodiments, the task 110 may be performed by determining or calculating the misalignment between alignment markers or targets (e.g., visual indicia) on the double-ended cable 200 and alignment markers or targets (e.g., visual indicia) on the multi-tier PCB 300 utilizing an optical system 600. In one or more embodiments, the alignment markers may include at least one alignment marker on an upper surface 303 of the second PCB 302, at least one alignment marker on a lower surface 204 of the first head 201 of the double-ended cable 200 facing the upper surface 303 of the second PCB 302, at least one alignment marker on an upper surface 304 of the first PCB 301, and at least one alignment marker on a lower surface 205 of the second head 202 of the double-ended cable 200 facing the upper surface 304 of the first PCB 301. FIGS. 3A-3B depict a pair of alignment markers 206 on the lower surface 204 of the first head 201 of the double-ended cable 200, a pair of alignment markers 207 on the lower surface 205 of the second head 202 of the double-ended cable 200, a pair of alignment markers 208 on a portion of the polyimide ribbon cable 203 proximate to the first head 201, and a pair of alignment markers 209 on a portion of the polyimide ribbon cable 203 proximate to the second head 202. FIG. 3B depicts that the alignment markers 208, 209 on the ribbon cable 203 are visible through the ribbon cable 203. FIG. 3C depicts a first pair of alignment markers 305 on the upper surface 303 of the second PCB 302 configured to be aligned with the pair of markers 206 on the first head 201 of the double-ended cable 200, and a second pair of alignment markers 306 on the upper surface 303 of the second PCB 302 configured to be aligned with the pair of markers 208 on the portion of the polyimide ribbon cable 203 proximate to the first head 201 of the double-ended cable 200. FIG. 3C also depicts a first pair of alignment markers 307 on the upper surface 304 of the first PCB 301 configured to be aligned with the pair of markers 207 on the second head 202 of the double-ended cable 200, and a second pair of alignment markers 308 on the upper surface 304 of the first PCB 302 configured to be aligned with the pair of markers 209 on the portion of the polyimide ribbon cable 203 proximate to the second head 202 of the double-ended cable 200. In one or more embodiments, the double-ended cable 200 and the multi-tier PCB 300 may include any other suitable number of alignment markers and the alignment markers may have any other suitable arrangement.

The optical system 600 may be any suitable type or kind of imaging system configured to image the alignment markers 206-209 and 305-308 on the double-ended cable 200 and the multi-tier PCB 300. In one or more embodiments, the optical system 600 may be a dual view microscope (e.g., a microscope configured to view or image both up and down). In one or more embodiments, the optical system 600 may be the same as the optical system described in "Development Done on Device Bonder to Address 3D Requirements in a Production Environment," P. Metzger, International Wafer Level Packaging Conference (IWLPC) Mar. 11-13, 2015, available at www.semanticscholar.org/paper/DEVELOP-MENT-DONE-ON-DEVICE-BONDER-TO-ADDRESS-3D-IN-Metzger-Macheda/fbc672f7 d46ab488b2d14a645e51683e093cad2e, the entire content of which is incorporated herein by reference. In one or more embodiments, the task 110 of aligning the first head 201 of the double-ended cable 200 to the second PCB 302 of the multi-tier PCB 300 includes inserting the optical system 600 between the first head 201 of the double-ended cable 200 and the second PCB 302 while the double-ended cable 200 is lifted by the top bonder arm 401 of the die bonder system 400, and imaging, with the optical system 600, the one or more alignment markers 305, 306 on the upper surface 303 of the second PCB 302 and the one or more alignment markers 206, 208 on the lower surface 204 of the first head 201 and on the ribbon cable 203 of the double-ended cable 200, superimposing the image of the one or more alignment markers 305, 306 on the upper surface 303 of the second PCB 302 on the image of the one or more alignment markers 206, 208 on the lower surface 204 of the first head 201 and on the ribbon cable 203 of the double-ended cable 200, and moving the top bonder arm 401 until the alignment targets (markers) 206, 208 are aligned with the alignment targets (markers) 305, 306, respectively, within a threshold alignment error, such as approximately (about) 2 μm or less (e.g., approximately (about) 1 μm or less). Similarly, in one or more embodiments, the method 100 includes inserting the optical system 600 between the second head 202 of the double-ended cable 200 and the first PCB 301 while the double-ended cable 200 is lifted by the top bonder arm 401 of the die bonder system 400, and imaging, with the optical system 600, the one or more alignment markers 307, 308 on the upper surface 304 of the first PCB 301 and the one or more alignment markers 207, 209 on the lower surface 205 of the second head 202 and on the ribbon cable 203 of the double-ended cable 200, superimposing the image of the one or more alignment markers 307, 308 on the upper surface 304 of the first PCB 301 on the image of the one or more alignment markers 207, 209 on the lower surface 205 of the second head 202 and on the ribbon cable 203 of the double-ended cable 200, and calculating or determining the required movement(s) of the top bonder arm 401 such that the alignment targets (markers) 207, 209 are aligned to the alignment targets (markers) 307, 308, respectively, within a threshold alignment error, such as approximately (about) 2 μm or less (e.g., approximately (about) 1 μm or less). In the illustrated embodiment, the required movements of the second head 202 of the double-ended cable 200 (e.g., x- and y-translational movements and the z vertical movement) to align the one or more alignment markers 207, 209 on the lower surface 205 of the second head 202 to the one or more alignment markers 307, 308 on the upper surface 304 of the first PCB 301 are calculated or determined based on the corrected position of the first head 201 of the double-ended cable 200 in which the one or more alignment markers 206, 208 on the lower surface 204 of the first head 201 are aligned with the one or more alignment markers 305, 306 on the upper surface 303 of the second PCB 302. Accordingly, in the illustrated embodiment, the positional corrections needed for alignment of the first head 201 of the double-ended cable 200 to the second PCB 302 and the second head 202 of the double-ended cable 200 to the first PCB 301 are determined by the optical system 600 before either the first head 201 or the second head 202 of the double-ended cable 200 is bonded to the multi-tier PCB 300.

In one or more embodiments, the alignment markers 206-209 and 305-308 may be pre-formed or pre-placed on the double-ended cable 200 and the multi-tier PCB 300. However, in one or more embodiments, the method 100 may include forming or placing the alignment markers 206-209 and 305-308 (e.g., visual indicia) on the double-ended cable 200 and the multi-tier PCB 300. The alignment markers 206-209 and 305-308 may be formed by any suitable process or processes, such as, for example, by laser inscribing the first and second PCBs 301, 302 and the first and second heads 201, 202 of the double-ended cable 200.

Figure 2C:
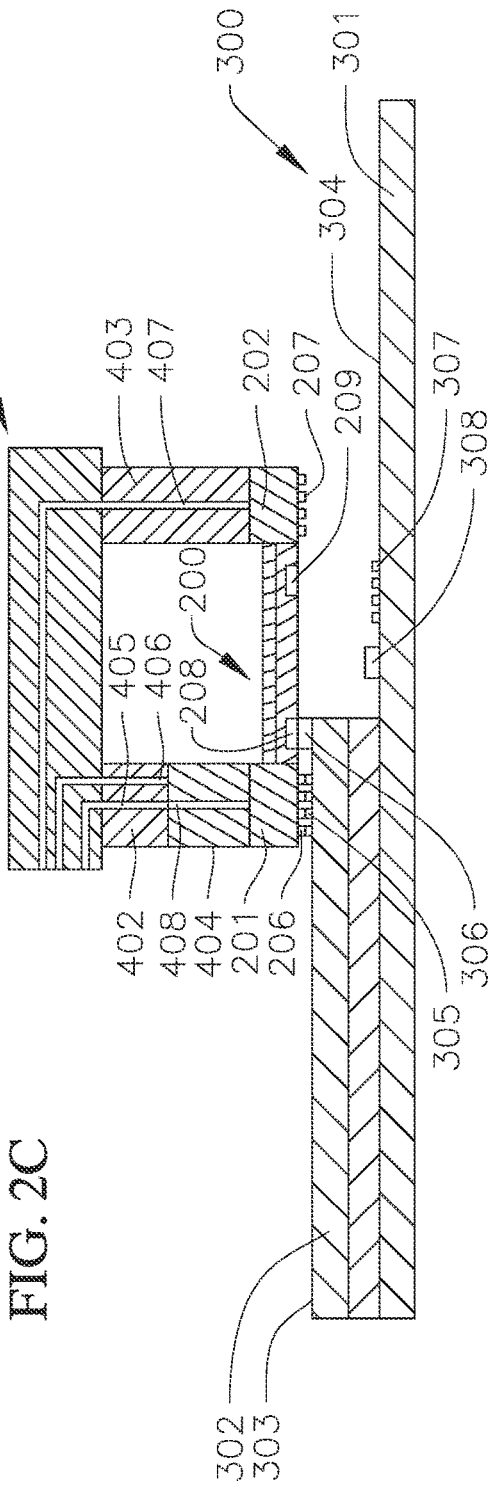
Figure 2D:
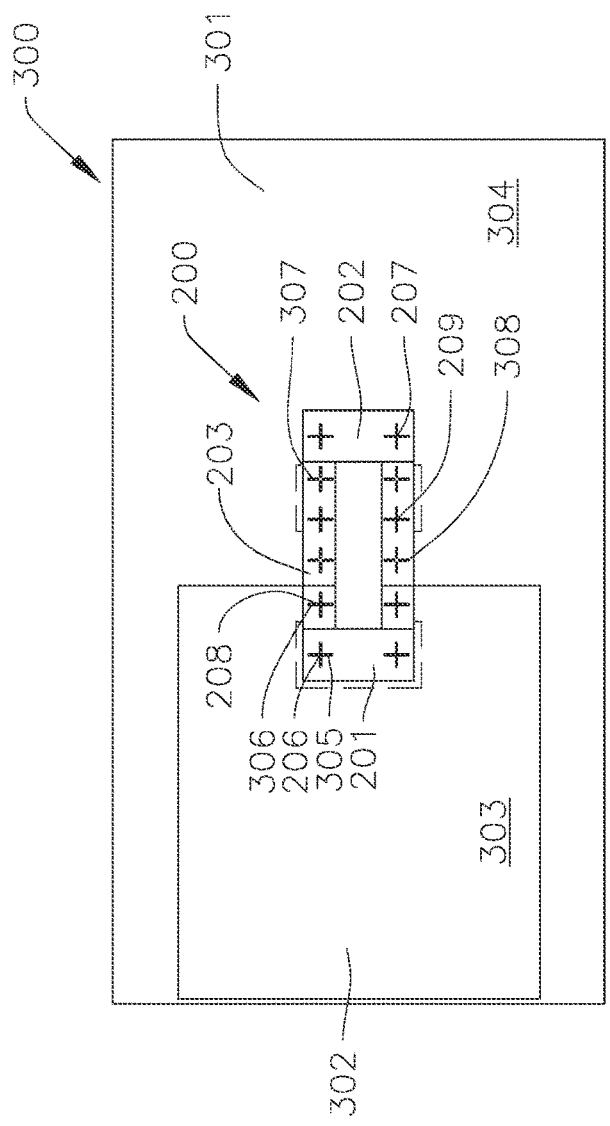

With reference now to the embodiment illustrated in FIGS. 1 and 2C-2D, the method 100 also includes a task 115 of bonding (e.g., flip-chip bonding) the first head 201 of the double-ended cable 200 to the second PCB 302 of the multi-tier PCB 300. In one or more embodiments, the task 115 of bonding the first head 201 of the double-ended cable 200 to the second PCB 302 includes lowering the top bonder arm 401 until the first head 201 of the double-ended cable 200 is in contact with the upper surface 303 of the second PCB 302. The task 115 of bonding the first head 201 of the double-ended cable 200 to the second PCB 302 may be performed by any suitable process or processes, such as by remelting solder balls on the first head 201 of the double-ended cable 200 and/or the second PCB 302 (e.g., by thermosonic bonding and/or a reflow solder process). As shown in FIG. 2D, the alignment achieved in task 110 between the alignment markers 305, 306 on the second PCB 302 and the alignment markers 206, 208 on the first head 201 and the ribbon cable 203 of the double-ended cable 200 is maintained following the task 115 of bonding the first head 201 of the double-ended cable 200 to the second PCB 302 of the multi-tier PCB 300. FIG. 2D also illustrates that the alignment markers 307, 308 on the first PCB 301 of the multi-tier PCB 300 are not yet aligned with the alignment markers 207, 209, respectively, on the double-ended cable 200.

Figure 2E:
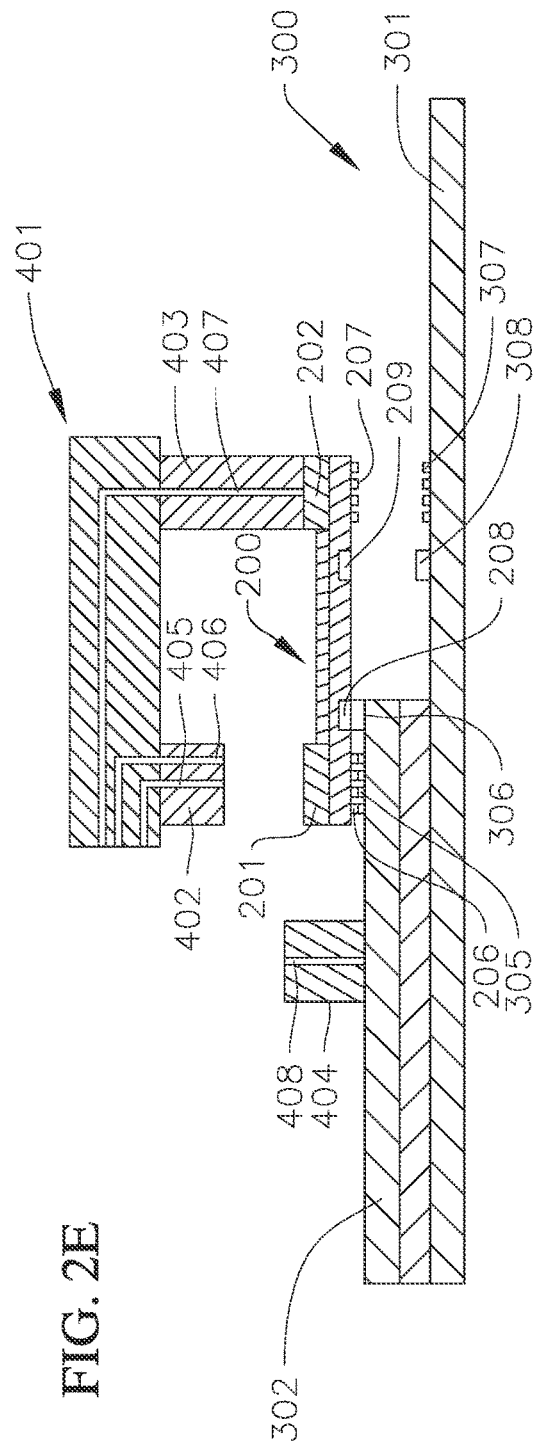
Figure 2F:
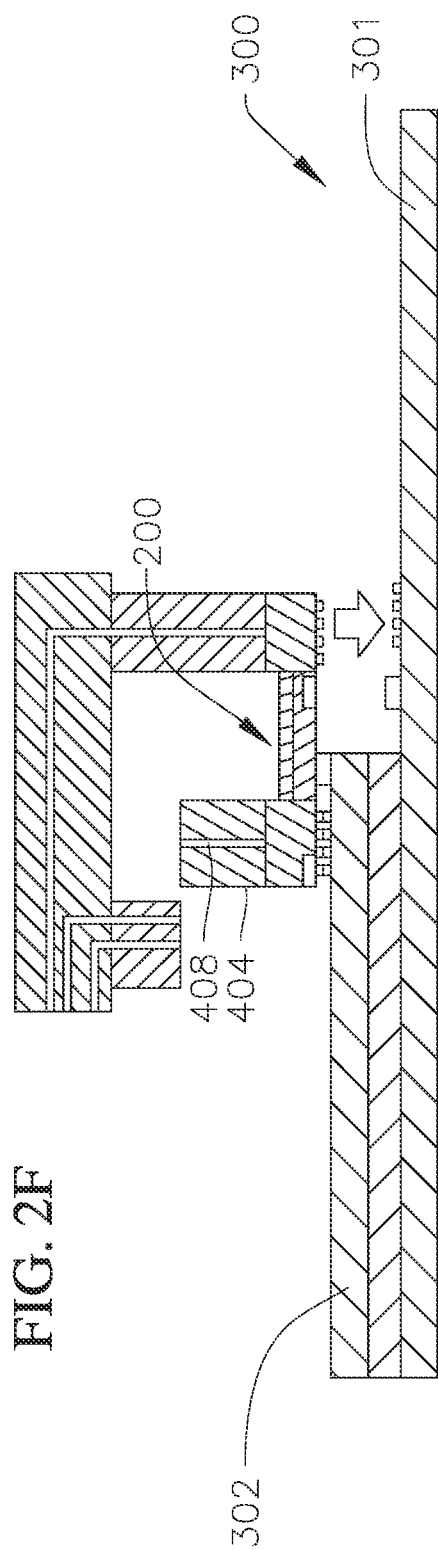

With continued reference to the embodiment illustrated in FIG. 1, the method 100 also includes a task 120 of removing, ejecting, or repositioning the temporary spacer 404. In one or more embodiments, the task 120 may include detaching the temporary spacer 404 from the first end effector 402 (e.g., by deactivating the second vacuum port 406 that is in the first end effector 402) and positioning the temporary spacer 404 on the second PCB 302 (as shown in FIG. 2E) or by leaving the temporary spacer 404 on the first head 201 of the double-ended cable 200 (as shown in FIG. 2F).

In the illustrated embodiment, the method 100 also includes a task 125 of aligning the second head 202 of the double-ended cable 200 with the first PCB 301. In one or more embodiments, the task 125 includes moving the top bonder arm 401 until the alignment targets 207, 209 on the second head 202 and the ribbon cable 203 of the double-ended cable 200 are aligned with the alignment targets (markers) 307, 308, respectively, on the first PCB 301 within a threshold alignment error, such as approximately (about) 2 μm or less (e.g., approximately (about) 1.5 μm, approximately (about) 1 μm, or less). In one or more embodiments, the task 125 is performed while the top bonder arm 401 remains in close proximity to the multi-tier PCB 300. The task 125 may be performed utilizing the information obtained by the optical system 600 in task 110 (e.g., the positions of the one or more alignment markers 307, 308 on the upper surface 304 of the first PCB 301 relative to the one or more alignment markers 207, 209 on the lower surface 205 of the second head 202 and on the ribbon cable 203 of the double-ended cable 200, as imaged by the optical system 600, and the determined or calculated required movement(s) of the top bonder arm 401 such that the alignment targets (markers) 207, 209 are aligned to the alignment targets (markers) 307, 308). That is, the x, y, and z offsets required to align the alignment targets 207, 209 on the second head 202 and the ribbon cable 203 of the double-ended cable 200 with the alignment targets (markers) 307, 308, respectively, on the first PCB 301 that were calculated in task 110 with reference to the corrected position of the first head 201 is utilized in task 125. Although in the illustrated embodiment the task 125 of aligning the alignment targets 207, 209 on the second head 202 and the ribbon cable 203 of the double-ended cable 200 with the alignment targets (markers) 307, 308, respectively, on the first PCB 301 is a blind step (i.e., the optical system 600 is not inserted between the second head 202 of the double-ended cable 200 and the first PCB 301 after the first head 201 of the double-ended cable 200 is bonded to the second PCB 302), in one or more embodiments the top bonder arm 401 of the die bonder system 400 has high x-y-translation and z vertical movement repeatability and precision (e.g., <0.5 um), which leads to the first head 201 being bonded to the second PCB 302 with relatively higher alignment accuracy (e.g., <±1 um) and the second head 202 being bonded to the first PCB 301 with relatively slightly less alignment accuracy (e.g., approximately (about) ±1.5 um).

Figure 2G:
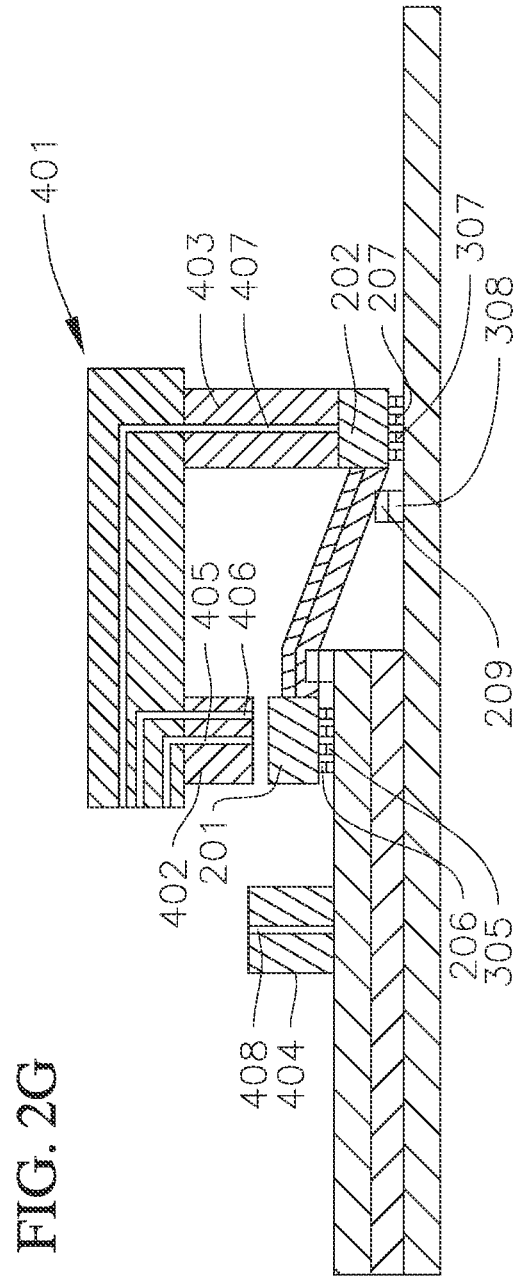
Figure 2H:
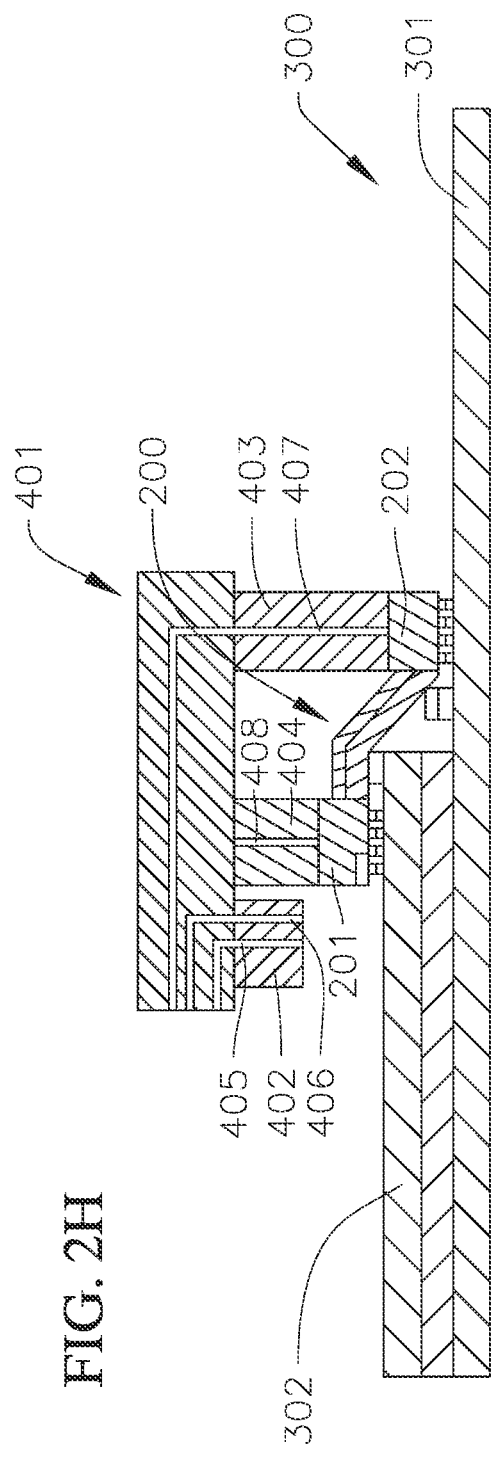
Figure 2I:
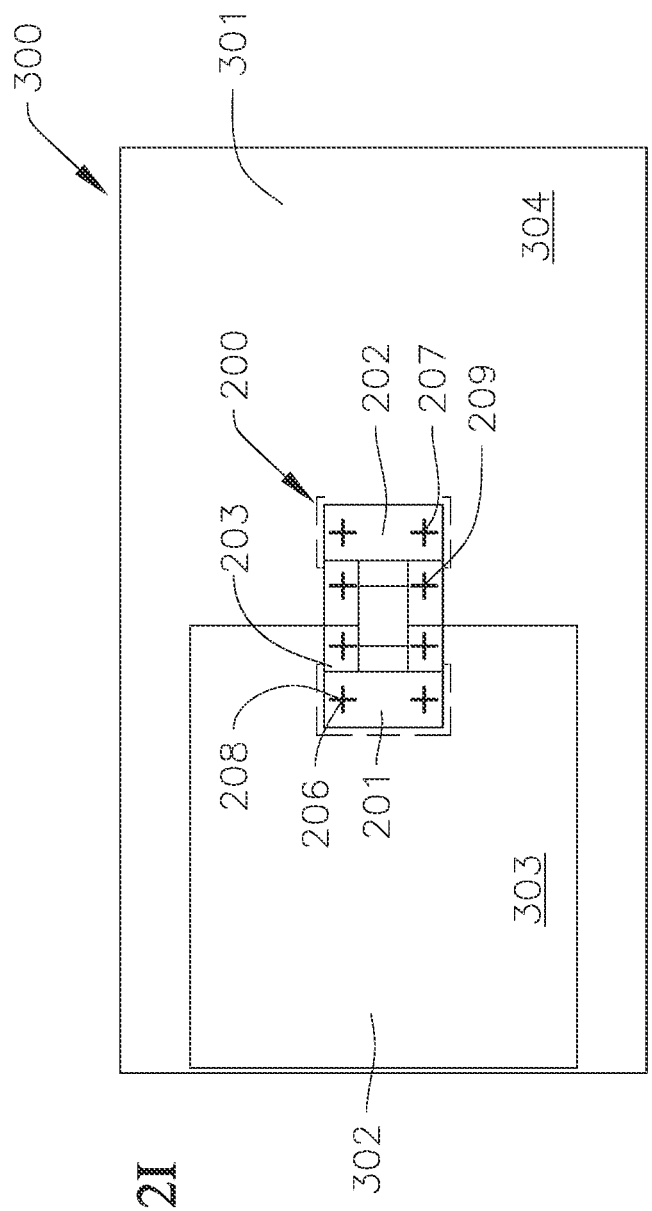

In the embodiment illustrated in FIGS. 1 and 2G-2I, the method 100 also includes a task 130 of bonding (e.g., flip-chip bonding) the second head 202 of the double-ended cable 200 to the first PCB 301 by any suitable process or processes, such as by remelting solder balls on the second head 202 of the double-ended cable 200 and/or the first PCB 301 (e.g., by thermosonic bonding and/or a reflow solder process). In one or more embodiments, the task 130 of bonding the second head 202 of the double-ended cable 200 to the first PCB 301 includes lowering the top bonder arm 401 until the second head 202 of the double-ended cable 200 is in contact with the upper surface 304 of the first PCB 301. FIG. 2G depicts the task 130 of bonding the second head 202 of the double-ended cable 200 to the first PCB 301 of the multi-tier PCB 300 when the temporary spacer 404 was positioned on the upper surface 303 of the second PCB 302 in task 120 (as shown in FIG. 2E) and FIG. 2H depicts the task 130 of bonding the second head 202 of the double-ended cable 200 to the first PCB 301 of the multi-tier PCB 300 when the temporary spacer 404 was left on the first head 201 of the double-ended cable 200 in task 120 (as shown in FIG. 2F). As shown in FIG. 2I, the alignment achieved in task 125 between the alignment markers 307, 308 on the first PCB 301 and the alignment markers 207, 209 on the second head 202 and the ribbon cable 203 of the double-ended cable 200 is maintained following the task 130 of bonding the second head 202 of the double-ended cable 200 to the first PCB 301 of the multi-tier PCB 300.

Figure 2J:
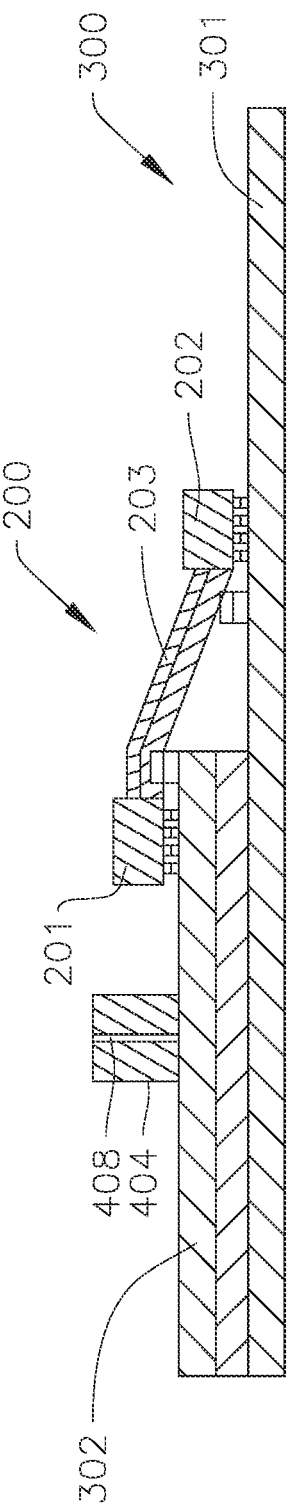
Figure 2K:
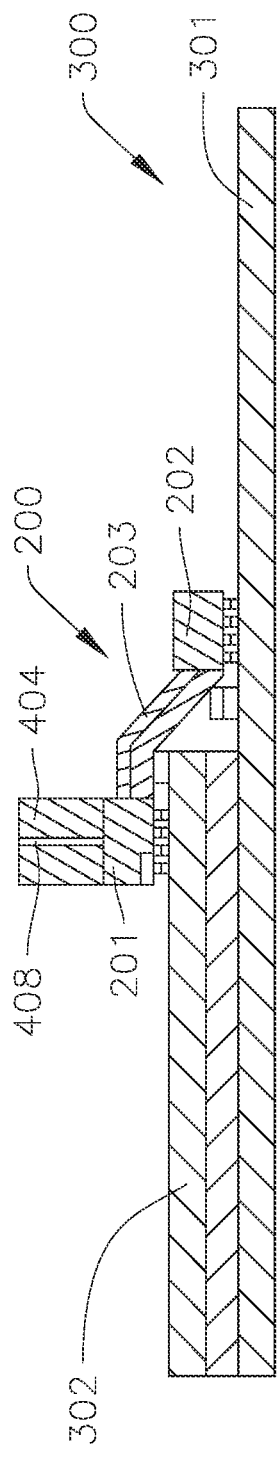

With reference now to the embodiment illustrated in FIGS. 1 and 2J-2K, the method 100 also includes a task 135 of releasing the second head 202 of the double-ended cable 200 from the top bonder arm 401 of the die bonder system 400 (e.g., by deactivating the third vacuum port 407 that is in the second end effector 403). FIG. 2J depicts the task 135 of releasing the second head 202 of the double-ended cable 200 from the top bonder arm 401 when the temporary spacer 404 was positioned on the upper surface 303 of the second PCB 302 in task 120 (as shown in FIG. 2E) and FIG. 2K depicts the task 135 of releasing the second head 202 of the double-ended cable 200 from the top bonder arm 401 when the temporary spacer 404 was left on the first head 201 of the double-ended cable 200 in task 120 (as shown in FIG. 2F).

Accordingly, in the embodiment illustrated in FIGS. 1 and 2A-2K, the double-ended cable 200 is held throughout the bonding process by the top bonder arm 401 (i.e., the double-ended cable 200 is not fully released until both of the first and second heads 201, 202 of the double-ended cable 200 are bonded to the first and second PCBs 301, 302 of the multi-tier PCB 300) and therefore the precise optical alignment is maintained for both of the first and second heads 201, 202 of the double-ended cable 200 with respect to the multi-tier PCB 300.

Figure 4:
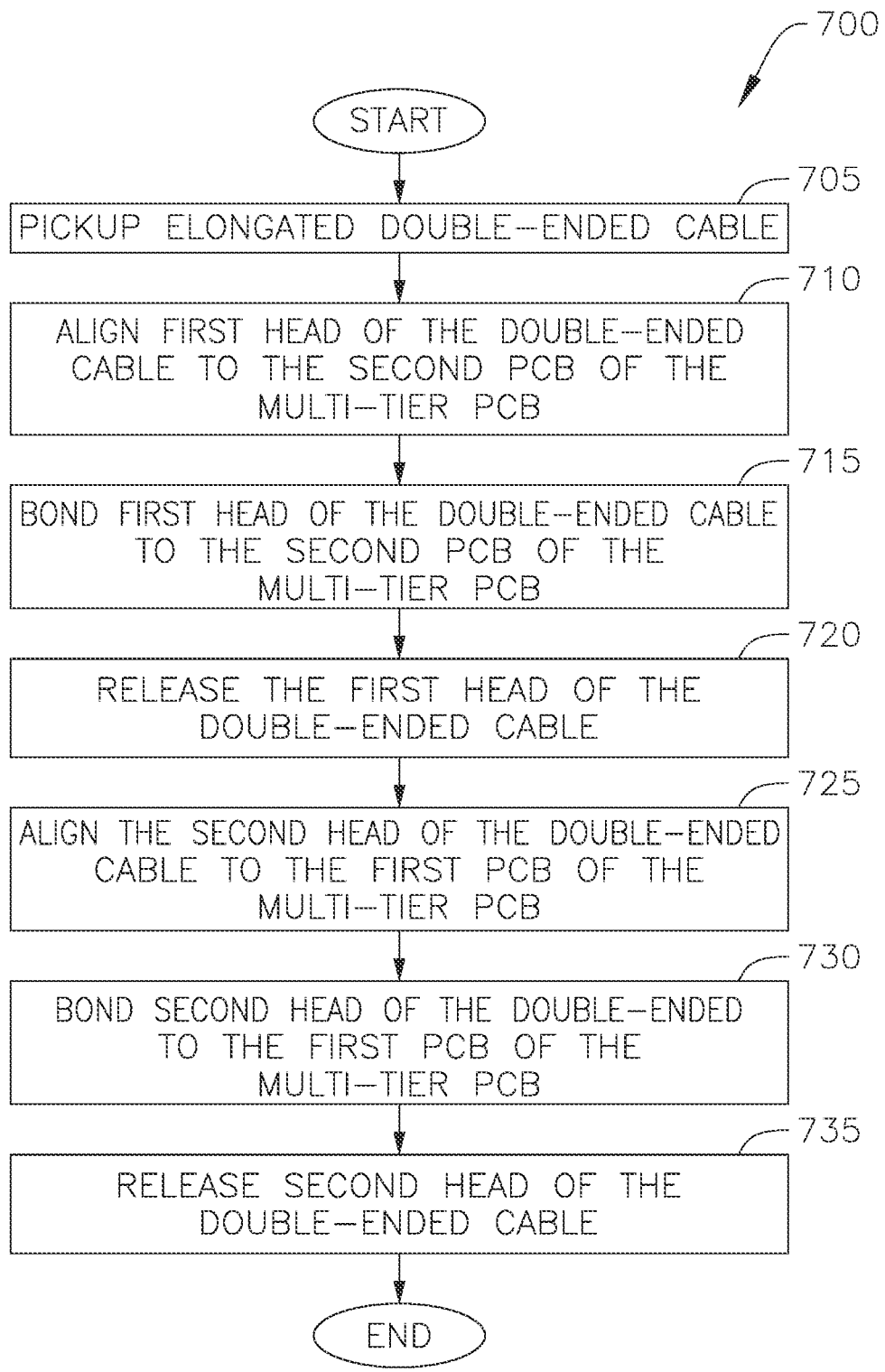
FIG. 4 is a flowchart depicting tasks of a method of bonding a cable to a substrate according to one embodiment of the present disclosure.

FIG. 4 is a flowchart illustrating tasks of a method 700 of bonding a double-ended cable 800 (which includes a first head 801, a second head 802, and polyimide ribbon cables 803 extending between the first and second heads 801, 802) to a multi-tier PCB 900 according to one embodiment of the present disclosure (e.g., bonding the second head 802 of the double-ended cable 800 to a first PCB 901 of the multi-tier PCB 900 and bonding the first head 801 of the double-ended cable 800 to a second PCB 902 of the multi-tier PCB 900 stacked on the first PCB 901). FIGS. 5A-5F depict a die bonder system 1000 according to one embodiment of the present disclosure performing various tasks illustrated in FIG. 4 for bonding the double-ended cable 800 to the multi-tier PCB 900.

Figure 5A:
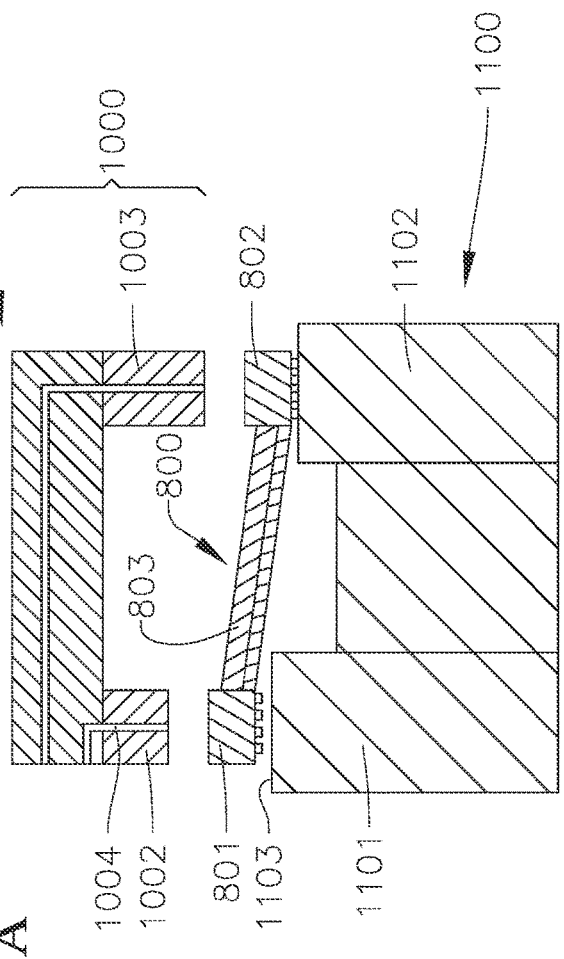
Figure 5B:
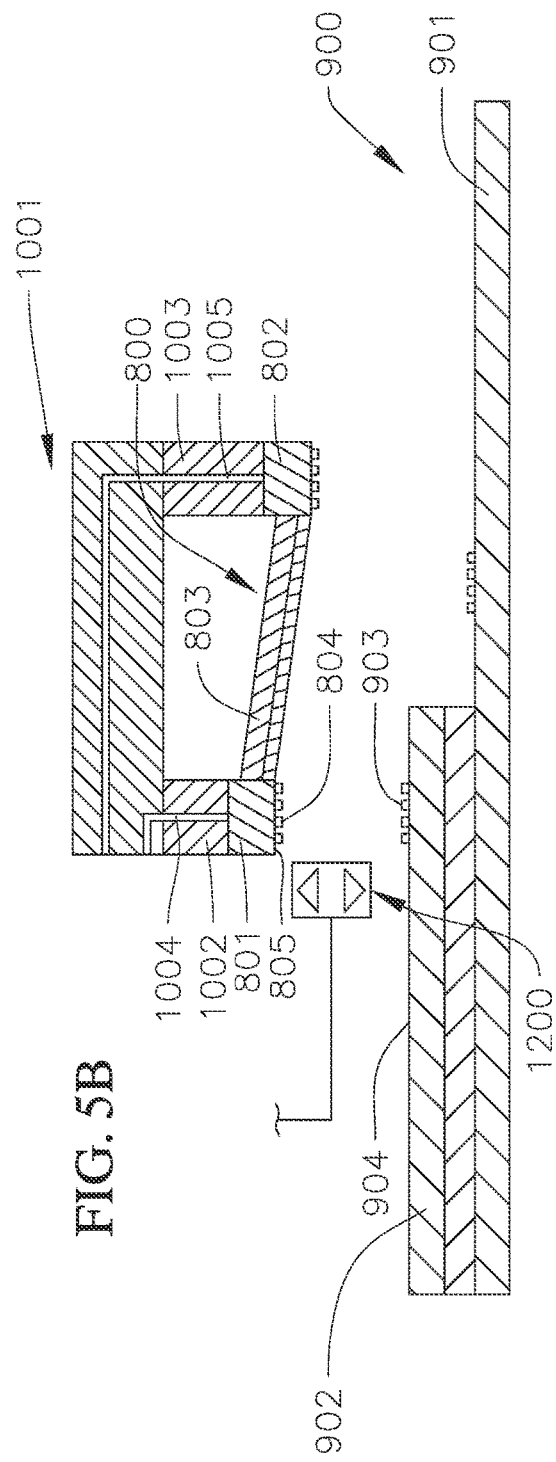

With reference now to the embodiment illustrated in FIGS. 4 and 5A-5B, the method 700 includes a task 705 of picking up the double-ended cable 800 utilizing a top bonder arm 1001 of the die bonder system 1000. In the illustrated embodiment, the top bonder arm 1001 includes a first end effector 1002 and a second end effector 1003. In the illustrated embodiment, the first end effector 1002 is shorter than the second end effector 1003 (e.g., a height of the first end effector 1002 is shorter than a height of the second end effector 1003). Additionally, in the illustrated embodiment, the task 705 of picking up the double-ended cable 800 includes picking up the double-ended cable 800 from a carrier 1100. In the illustrated embodiment, the first head 801 of the double-ended cable 800 is supported on a first pedestal 1101 of the carrier 1100 and the second head 802 of the double-ended cable 800 is supported on a second pedestal 1102 of the carrier 1100. In the illustrated embodiment, the first pedestal 1101 is taller than the second pedestal 1102 (e.g., the carrier 1100 defines a non-planar support surface 1103) and a difference in height between the first pedestal 1101 and the second pedestal 1102 is equal or substantially equal to a difference in height between the second end effector 1003 and the first end effector 1002 of the top bonder arm 1001. Moreover, in the illustrated embodiment, the lateral spacing between the first end effector 1002 and the second end effector 1003 is equal or substantially equal to the lateral spacing between the first pedestal 1101 and the second pedestal 1102 of the carrier 1100, and equal to or substantially equal to a length of the ribbon cable 803 between the first head 801 and the second head 802 of the double-ended cable 800 when the ribbon cable 803 is elongated. Accordingly, during the task 705 of picking up the double-ended cable 800, the double-ended cable 800 is angled (e.g., non-planar) and the ribbon cable 803 of the double-ended cable 800 is elongated or taut between the first end effector 1002 and the second end effector 1003.

Furthermore, in the illustrated embodiment, the top bonder arm 1001 includes a first vacuum port 1004 in the first end effector 1002, and a second vacuum port 1005 in the second end effector 1003. In one or more embodiments, the first and second vacuum ports 1004, 1005 are independently controllable. In the illustrated embodiment, the task of 705 picking up the double-ended cable 800 includes lowering the top bonder arm 1001 of the die bonder system 1000 until the first end effector 1002 is in contact with or in close proximity to the first head 801 of the double-ended cable 800, and the second end effector 1003 is in contact with or in close proximity to the second head 802 of the double-ended cable 800. Furthermore, the task 705 includes activating the first vacuum port 1004 and the second vacuum port 1005. Activating the first and second vacuum ports 1004, 1005 causes the first head 801 of the double-ended cable 800 to be suctioned to the first end effector 1002 and the second head 802 of the double-ended cable 800 to be suctioned to the second end effector 1003.

With reference now to the embodiment illustrated in FIGS. 4 and 5B, the method 700 also includes a task 710 of aligning the first head 801 of the double-ended cable 800 to the second PCB 902 of the multi-tier PCB 900. In one or more embodiments, the task 710 of aligning may be performed by aligning one or more alignment markers or targets 804 (e.g., visual indicia) on a lower surface 805 of the first head 801 and/or the ribbon cable 803 of the double-ended cable 800 with one or more alignment markers or targets 903 (e.g., visual indicia) on an upper surface 904 of the second PCB 902 of the multi-tier PCB 900 utilizing an optical system 1200. The optical system 1200 may be any suitable type or kind of imaging system configured to image the alignment markers 804, 903 on the double-ended cable 800 and the multi-tier PCB 900. In one or more embodiments, the optical system 1200 may be the same as or similar to the optical system 600 described above with reference to the embodiment depicted in FIGS. 1 and 2A-2K (e.g., the optical system 1200 may be a dual view microscope). In one or more embodiments, the task 710 of aligning the first head 801 of the double-ended cable 800 to the second PCB 902 of the multi-tier PCB 900 includes inserting the optical system 1200 between the first head 801 of the double-ended cable 800 and the second PCB 902 while the double-ended cable 800 is lifted by the top bonder arm 1001 of the die bonder system 1000, and imaging, with the optical system 1200, the one or more alignment markers 903 on the upper surface 904 of the second PCB 902 and the one or more alignment markers 804 on the lower surface 805 of the first head 801 and/or the ribbon cable 803 of the double-ended cable 800, superimposing the image of the one or more alignment markers 903 on the upper surface 904 of the second PCB 902 on the image of the one or more alignment markers 804 on the lower surface 805 of the first head 801 of the double-ended cable 800, and moving the top bonder arm 1001 until the alignment targets 804, 903 are aligned with a threshold alignment error, such as approximately (about) 2 µm or less (e.g., approximately (about) 1 µm or less). Similarly, in one or more embodiments, the task 710 includes inserting the optical system 1200 between the second head 802 of the double-ended cable 800 and the first PCB 901 while the double-ended cable 800 is lifted by the top bonder arm 1001 of the die bonder system 1000, and imaging, with the optical system 1200, one or more alignment markers or targets 806 (e.g., visual indicia) on a lower surface 807 of the second head 802 and/or the ribbon cable 803 of the double-ended cable 800 and one or more alignment markers or targets 905 (e.g., visual indicia) on an upper surface 906 of the first PCB 901 of the multi-tier PCB 900, superimposing the image of the one or more alignment markers 905 on the upper surface 906 of the first PCB 901 on the image of the one or more alignment markers 806 on the lower surface 807 of the second head 802 and/or on the ribbon cable 803 of the double-ended cable 800, and calculating or determining the required movement(s) of the top bonder arm 1001 such that the alignment targets (markers) 806 are aligned to the alignment targets (markers) 905 within a threshold alignment error, such as approximately (about) 2 µm or less (e.g., approximately (about) 1 µm or less). In the illustrated embodiment, the required movements of the second head 802 of the double-ended cable 800 (e.g., x- and y-translational movements and the z vertical movement) to align the one or more alignment markers 806 on the lower surface 807 of the second head 802 and/or the ribbon cable 803 to the one or more alignment markers 905 on the upper surface 906 of the first PCB 901 are calculated or determined based on the corrected position of the first head 801 of the double-ended cable 800 in which the one or more alignment markers 804 on the lower surface 805 of the first head 801 are aligned with the one or more alignment markers 903 on the upper surface 904 of the second PCB 902. Accordingly, in the illustrated embodiment, the positional corrections needed for alignment of the first head 801 of the double-ended cable 800 to the second PCB 902 and the second head 802 of the double-ended cable 800 to the first PCB 901 are determined by the optical system 1200 before either the first head 801 or the second head 802 of the double-ended cable 800 is bonded to the multi-tier PCB 900. Accordingly, in one or more embodiments, the optical system 1200 may not be inserted between the second head 802 and the first PCB 901.

With reference now to the embodiment illustrated in FIGS. 4 and 5C, the method 700 also includes a task 715 of bonding (e.g., flip-chip bonding) of the first head 801 of the double-ended cable 800 to the second PCB 902 of the multi-tier PCB 900. In one or more embodiments, the task 715 of bonding the first head 801 of the double-ended cable 800 to the second PCB 902 includes lowering the top bonder arm 1001 until the first head 801 of the double-ended cable 800 is in contact with the upper surface 904 of the second PCB 902. The task 715 of bonding the first head 801 of the double-ended cable 800 to the second PCB 902 may be performed by any suitable process or processes, such as by remelting solder balls on the first head 801 of the double-ended cable 800 and/or the second PCB 902 (e.g., by thermosonic bonding and/or a reflow solder process). The alignment achieved in task 710 between the alignment marker(s) 903 on the upper surface 904 of the second PCB 902 and the alignment marker(s) 804 on the lower surface 805 of the first head 801 and/or the ribbon cable 803 of the double-ended cable 800 is maintained following the task 715 of bonding the first head 801 of the double-ended cable 800 to the second PCB 902 of the multi-tier PCB 900.

With reference now to the embodiment illustrated in FIGS. 4 and 5D, the method 700 also includes a task 720 of releasing the first head 801 of the double-ended cable 800 from the top bonder arm 1001 of the die bonder system 1000 (e.g., by deactivating the first vacuum port 1004 that is in the first end effector 1002).

In the illustrated embodiment, the method 700 also includes a task 725 of aligning the second head 802 of the double-ended cable 800 to the first PCB 901 of the multi-tier PCB 900. In one or more embodiments, the task 725 of aligning may be performed by moving the top bonder arm 1001 until the alignment markers 806, 905 are aligned with a threshold alignment error, such as approximately (about) 2 μm or less (e.g., approximately (about) 1 μm or less). Additionally, in the illustrated embodiment, the task 725 of aligning the second head 802 of the double-ended cable 800 to the first PCB 901 of the multi-tier PCB 900 includes moving the top bonder arm 1001 such that the second end effector 1003 moves toward the second PCB 902 and the first head 801 of the double-ended cable 800 bonded thereon. In one or more embodiments, the task 725 is performed while the top bonder arm 1001 remains in close proximity to the multi-tier PCB 900. The task 725 may be performed utilizing the information obtained by the optical system 1200 in task 710. That is, the x, y, and z offsets required to align the alignment targets 806 on the second head 802 and/or the ribbon cable 803 of the double-ended cable 800 with the alignment targets (markers) 905 on the first PCB 901 that was calculated in task 710 with reference to the corrected position of the first head 801 is utilized in task 725. Although in the illustrated embodiment the task 725 of aligning the alignment targets 806 on the second head 802 and/or the ribbon cable 803 of the double-ended cable 800 with the alignment targets (markers) 905 on the first PCB 901 is a blind step (i.e., the optical system 1200 is not inserted between the second head 802 of the double-ended cable 800 and the first PCB 901 after the first head 801 of the double-ended cable 800 is bonded to the second PCB 902), in one or more embodiments the top bonder arm 1001 of the die bonder system 1000 has high x-y-translation and z vertical movement repeatability and precision (e.g., <0.5 um), which leads to the first head 801 being bonded to the second PCB 902 with relatively higher alignment accuracy (e.g., <±1 um) and the second head 802 being bonded to the first PCB 901 with relatively slightly less alignment accuracy (e.g., approximately (about) ±1.5 um).

The alignment markers 804, 806, 903, 905 may be provided in any suitable number and any suitable arrangement. In one or more embodiments, the alignment markers 804, 806, 903, 905 may be the same as the alignment markers illustrated in FIGS. 3A-3C. In one or more embodiments, the alignment markers 804, 806, 903, 905 may be pre-formed or pre-placed on the double-ended cable 800 and the multi-tier PCB 900. However, in one or more embodiments, the method 700 may include forming or placing the alignment markers 804, 806, 903, 905 (e.g., visual indicia) on the cable 800 and the multi-tier PCB 900. The markers 804, 806, 903, 905 may be formed by any suitable process or processes, such as, for example, by laser inscribing the multi-tier PCB 900 and the first and second heads 801, 802 of the double-ended cable 800.

Figure 5E:
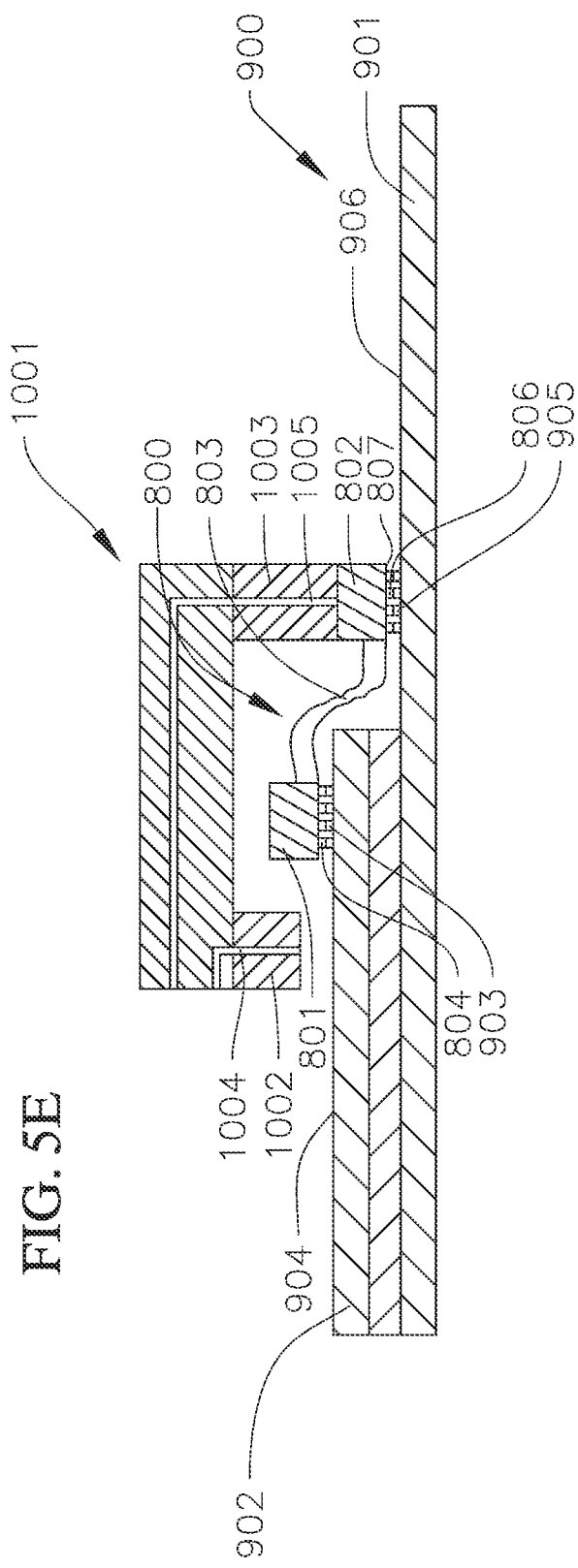

With reference now to the embodiment illustrated in FIGS. 4 and 5E, the method 700 also includes a task 730 of bonding (e.g., flip-chip bonding) the second head 802 of the double-ended cable 800 to the first PCB 901 of the multi-tier PCB 900. In one or more embodiments, the task 730 of bonding the second head 802 of the double-ended cable 800 to the first PCB 901 includes lowering the top bonder arm 1001 until the second head 802 of the double-ended cable 800 is in contact with the upper surface 906 of the first PCB 901. In the illustrated embodiment, the first end effector 1002 is shorter than the second end effector 1003, which enables the top bonder arm 1001 to be lowered in task 730 without the first end effector 1002 contacting the second PCB 902 (which would otherwise occur if the first end effector 1002 was the same height as the second end effector 1003). The task 730 of bonding the second head 802 of the double-ended cable 800 to the first PCB 901 may be performed by any suitable process or processes, such as by remelting solder balls on the second head 802 of the double-ended cable 800 and/or the first PCB 901 (e.g., by thermosonic bonding and/or a reflow solder process). The alignment achieved in task 725 between the alignment marker(s) 806 on the lower surface 807 of the second head 802 and/or the ribbon cable 803 of the double-ended cable 800 and the alignment marker(s) 905 on the upper surface 906 of the first PCB 901 of the multi-tier PCB 900 is maintained following the task 730 of bonding the second head 802 of the double-ended cable 800 to the first PCB 901 of the multi-tier PCB 900.

Figure 5F:
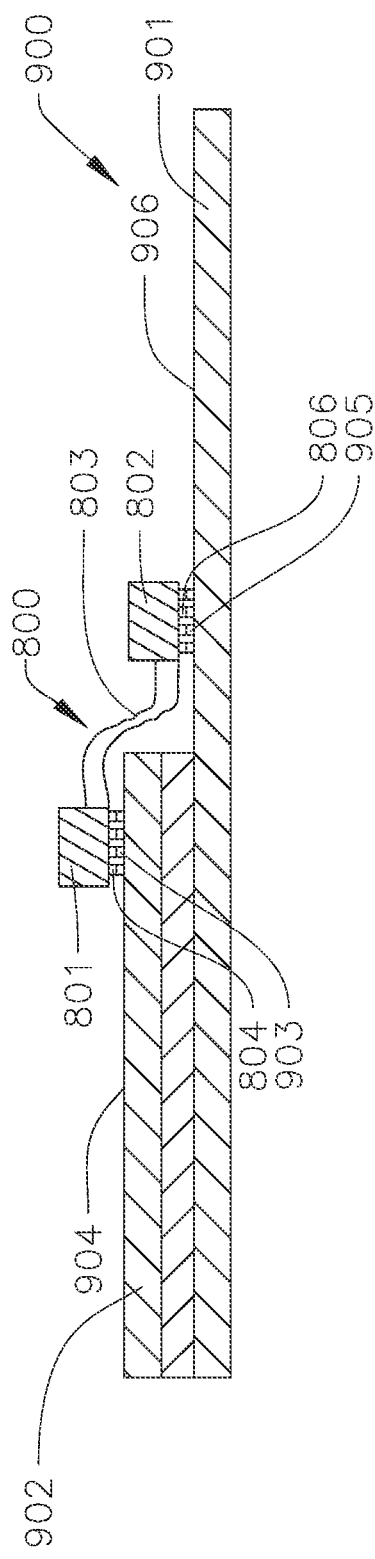

With reference now to the embodiment illustrated in FIGS. 4 and 5F, the method 700 also includes a task 735 of releasing the second head 802 of the double-ended cable 800 from the top bonder arm 1001 of the die bonder system 1000 (e.g., by deactivating the second vacuum port 1005 that is in the second end effector 1003).

Figure 6:
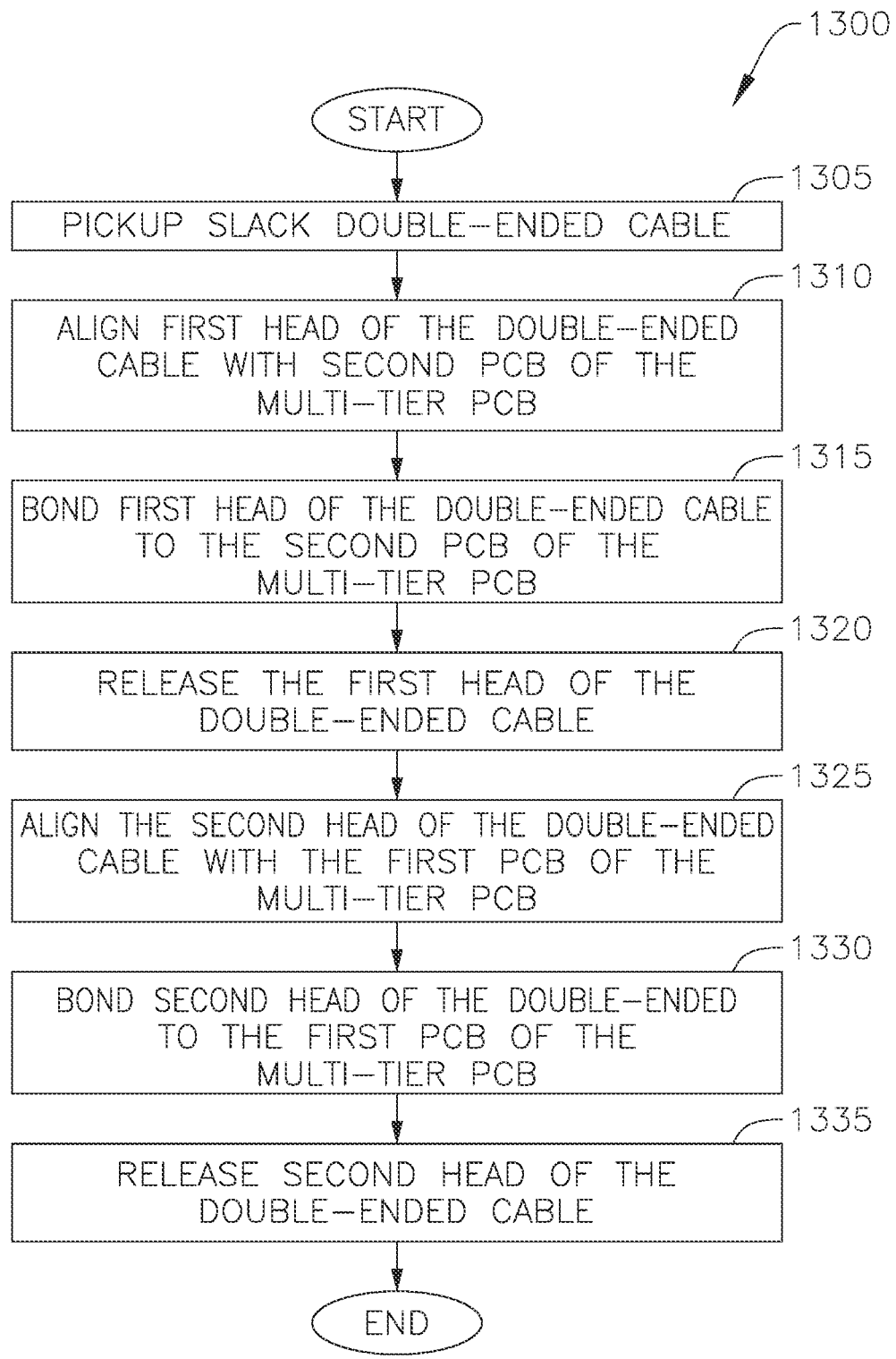
FIG. 6 is a flowchart depicting tasks of a method of bonding a cable to a substrate according to one embodiment of the present disclosure.

FIG. 6 is a flowchart illustrating tasks of a method 1300 of bonding a double-ended cable 1400 (which includes a first head 1401, a second head 1402, and polyimide ribbon cables 1403 extending between the first and second heads 1401, 1402) to a multi-tier PCB 1500 according to one embodiment of the present disclosure (e.g., bonding the second head 1402 of the double-ended cable 1400 to a first PCB 1501 of the multi-tier PCB 1500 and bonding the first head 1401 of the double-ended cable 1400 to a second PCB 1502 of the multi-tier PCB 1500 stacked on the first PCB 1501). FIGS. 7A-7E depict a die bonder system 1600 according to one embodiment of the present disclosure performing various tasks illustrated in FIG. 6 for bonding the double-ended cable 1400 to the multi-tier PCB 1500.

With reference now to the embodiment illustrated in FIGS. 6 and 7A, the method 1300 includes a task 1305 of picking up the double-ended cable 1400 utilizing a top bonder arm 1601 of the die bonder system 1600. In the illustrated embodiment, the top bonder arm 1601 includes a first end effector 1602 and a second end effector 1603. In the illustrated embodiment, the first end effector 1602 is shorter than the second end effector 1603. Additionally, in the illustrated embodiment, the task 1305 of picking up the double-ended cable 1400 includes picking up the double-ended cable 1400 from a carrier 1700. In the illustrated embodiment, the first head 1401 of the double-ended cable 1400 is supported on a first pedestal 1701 of the carrier 1700 and the second head 1402 of the double-ended cable 1400 is supported on a second pedestal 1702 of the carrier 1700. In the illustrated embodiment, the first pedestal 1701 is taller than the second pedestal 1702 and a difference in height between the first pedestal 1701 and the second pedestal 1702 is equal or substantially equal to a difference in height between the second end effector 1603 and the first end effector 1602 of the top bonder arm 1601. Moreover, in the illustrated embodiment, the lateral spacing between the first end effector 1602 and the second end effector 1603 is equal or substantially equal to the lateral spacing between the first pedestal 1701 and the second pedestal 1702 of the carrier 1700, and is shorter than a length of the ribbon cable 1403 between the first head 1401 and the second head 1402 of the double-ended cable 1400 when the ribbon 1403 is elongated (e.g., taut). Accordingly, during the task 1305 of picking up the double-ended cable 1400, the double-ended cable 1400 is angled (e.g., non-planar) and the ribbon 1403 of the double-ended cable 1400 is slack between the first end effector 1602 and the second end effector 1603.

Furthermore, in the illustrated embodiment, the top bonder arm 1601 includes a first vacuum port 1604 in the first end effector 1602, and a second vacuum port 1605 in the second end effector 1603. In one or more embodiments, the first and second vacuum ports 1604, 1605 are independently controllable. In the illustrated embodiment, the task of 1305 picking up the double-ended cable 1400 includes lowering the top bonder arm 1601 of the die bonder system 1600 until the first end effector 1602 is in contact with or in close proximity to the first head 1401 of the double-ended cable 1400, and the second end effector 1603 is in contact with or in close proximity to the second head 1402 of the double-ended cable 1400. Furthermore, the task 1305 includes activating the first vacuum port 1604 and the second vacuum port 1605. Activating the first and second vacuum ports 1604, 1605 causes the first head 1401 of the double-ended cable 1400 to be suctioned to the first end effector 1602 and the second head 1402 of the double-ended cable 1400 to be suctioned to the second end effector 1603.

With reference now to the embodiment illustrated in FIGS. 6 and 7B, the method 1300 also includes a task 1310 of aligning the first head 1401 of the double-ended cable 1400 to the second PCB 1502 of the multi-tier PCB 1500. In one or more embodiments, the task 1310 of aligning may be performed by aligning one or more alignment markers or targets 1404 (e.g., visual indicia) on a lower surface 1405 of the first head 1401 and/or the ribbon cable 1403 of the double-ended cable 1400 with one or more alignment markers or targets 1503 (e.g., visual indicia) on an upper surface 1504 of the second PCB 1502 of the multi-tier PCB 1500 utilizing an optical system 1800. The optical system 1800 may be any suitable type or kind of imaging system configured to image the alignment markers 1404, 1503 on the double-ended cable 1400 and the multi-tier PCB 1500. In one or more embodiments, the optical system 1800 may be the same as or similar to the optical system 600 described above with reference to the embodiment depicted in FIGS. 1 and 2A-2I (e.g., the optical system 1800 may be a dual view microscope). In one or more embodiments, the task 1310 of aligning the first head 1401 of the double-ended cable 1400 to the second PCB 1502 of the multi-tier PCB 1500 includes inserting the optical system 1800 between the first head 1401 of the double-ended cable 1400 and the second PCB 1502 while the double-ended cable 1400 is lifted by the top bonder arm 1601 of the die bonder system 1600, and imaging, with the optical system 1800, the one or more alignment markers 1503 on the upper surface 1504 of the second PCB 1502 and the one or more alignment markers 1404 on the lower surface 1405 of the first head 1401 and/or the ribbon cable 1403 of the double-ended cable 1400, superimposing the image of the one or more alignment markers 1503 on the upper surface 1504 of the second PCB 1502 on the image of the one or more alignment markers 1404 on the lower surface 1405 of the first head 1401 of the double-ended cable 1400, and moving the top bonder arm 1601 until the alignment targets 1404, 1503 are aligned with a threshold alignment error, such as approximately (about) 2 μm or less (e.g., approximately (about) 1 μm or less).

Similarly, in one or more embodiments, the task 1310 includes inserting the optical system 1800 between the second head 1402 of the double-ended cable 1400 and the first PCB 1501 while the double-ended cable 1400 is lifted by the top bonder arm 1601 of the die bonder system 1600, and imaging, with the optical system 1800, one or more alignment markers or targets 1406 (e.g., visual indicia) on a lower surface 1407 of the second head 1402 and/or the ribbon cable 1403 of the double-ended cable 1400 and one or more alignment markers or targets 1505 (e.g., visual indicia) on an upper surface 1506 of the first PCB 1501 of the multi-tier PCB 1500, superimposing the image of the one or more alignment markers 1505 on the upper surface 1506 of the first PCB 1501 on the image of the one or more alignment markers 1406 on the lower surface 1407 of the second head 1402 and/or on the ribbon cable 1403 of the double-ended cable 1400, and calculating or determining the required movement(s) (performed in subsequent task 1325) of the top bonder arm 1601 such that the alignment targets (markers) 1406 are aligned to the alignment targets (markers) 1505 within a threshold alignment error, such as approximately (about) 2 μm or less (e.g., approximately (about) 1 μm or less).

In the illustrated embodiment, the required movements (performed in subsequent task 1325) of the second head 1402 of the double-ended cable 1400 (e.g., x- and y-translational movements and the z vertical movement) to align the one or more alignment markers 1406 on the lower surface 1407 of the second head 1402 and/or the ribbon cable 1403 to the one or more alignment markers 1505 on the upper surface 1506 of the first PCB 1501 are calculated or determined based on the corrected position of the first head 1401 of the double-ended cable 1400 in which the one or more alignment markers 1404 on the lower surface 1405 of the first head 1401 are aligned with the one or more alignment markers 1503 on the upper surface 1504 of the second PCB 1502 (e.g., based on a known or expected relationship between the positions of the markers 1503 and 1505). Accordingly, in the illustrated embodiment, the positional corrections needed for alignment of the first head 1401 of the double-ended cable 1400 to the second PCB 1502 and the second head 1402 of the double-ended cable 1400 to the first PCB 1501 are determined by the optical system 1800 before either the first head 1401 or the second head 1402 of the double-ended cable 1400 is bonded to the multi-tier PCB 1500.

With reference now to the embodiment illustrated in FIGS. 6 and 7C, the method 1300 also includes a task 1315 of bonding (e.g., flip-chip bonding) of the first head 1401 of the double-ended cable 1400 to the second PCB 1502 of the multi-tier PCB 1500. In one or more embodiments, the task 1315 of bonding the first head 1401 of the double-ended cable 1400 to the second PCB 1502 includes lowering the top bonder arm 1601 until the first head 1401 of the double-ended cable 1400 is in contact with the upper surface 1504 of the second PCB 1502. The task 1315 of bonding the first head 1401 of the double-ended cable 1400 to the second PCB 1502 may be performed by any suitable process or processes, such as by remelting solder balls on the first head 1401 of the double-ended cable 1400 and/or the second PCB 1502 (e.g., by thermosonic bonding and/or a reflow solder process). The alignment achieved in task 1310 between the alignment marker(s) 1503 on the upper surface 1504 of the second PCB 1502 and the alignment marker(s) 1404 on the lower surface 1405 of the first head 1401 and/or the ribbon cable 1403 of the double-ended cable 1400 is maintained following the task 1315 of bonding the first head 1401 of the double-ended cable 1400 to the second PCB 1502 of the multi-tier PCB 1500.

With reference now to the embodiment illustrated in FIGS. 6 and 7C, the method 1300 also includes a task 1320 of releasing the first head 1401 of the double-ended cable 1400 from the top bonder arm 1601 of the die bonder system 1600 (e.g., by deactivating the first vacuum port 1604 that is in the first end effector 1602).

In the illustrated embodiment, the method 1300 also includes a task 1325 of aligning the second head 1402 of the double-ended cable 1400 to the first PCB 1501 of the multi-tier PCB 1500. In the illustrated embodiment, the task 1325 of aligning the second head 1402 of the double-ended cable 1400 to the first PCB 1501 of the multi-tier PCB 1500 includes moving the top bonder arm 1601 such that the second end effector 1603 moves away from the second PCB 1502 and the first head 1401 of the double-ended cable 1400 bonded thereon, and such that the first end effector 1602 is no longer positioned above the second PCB 1502 (i.e., the first end effector 1602 is positioned above the first PCB 1501, but is not positioned above the second PCB 1502). In the illustrated embodiment, the lateral spacing or distance between the first end effector 1602 and the second end effector 1603 is less than the length of the ribbon cable 1403 of the double-ended cable 1400 in an extended position, which enables the top bonder arm 1601 to move away from the second PCB 1502 such that the first end effector 1602 is no longer positioned above the second PCB 1502. In one or more embodiments, the task 1325 is performed while the top bonder arm 1601 remains in close proximity to the multi-tier PCB 1500. The task 1325 may be performed utilizing the information obtained by the optical system 1800 in task 1310. That is, the x, y, and z offsets required to align the alignment targets 1406 on the second head 1402 and/or the ribbon cable 1403 of the double-ended cable 1400 with the alignment targets (markers) 1505 on the first PCB 1501 that were calculated in task 1310 with reference to the corrected position of the first head 1401 is utilized in task 1325 to move the top bonder arm 1601 such that the second head 1402 of the double-ended cable 1400 is aligned to the first PCB 1501 of the multi-tier PCB 1500. Although in the illustrated embodiment the task 1325 of aligning the alignment targets 1406 on the second head 1402 and/or the ribbon cable 1403 of the double-ended cable 1400 with the alignment targets (markers) 1505 on the first PCB 1501 is a blind step (i.e., the optical system 1800 is not inserted between the second head 1402 of the double-ended cable 1400 and the first PCB 1501 after the first head 1401 of the double-ended cable 1400 is bonded to the second PCB 1502), in one or more embodiments the top bonder arm 1601 of the die bonder system 1600 has high x-y-translation and z vertical movement repeatability and precision (e.g., <0.5 um), which leads to the first head 1401 being bonded to the second PCB 1502 with relatively higher alignment accuracy (e.g., <±1 um) and the second head 1402 being bonded to the first PCB 1501 with relatively slightly less alignment accuracy (e.g., approximately (about) ±1.5 um).

The alignment markers 1404, 1406, 1503, 1505 may be provided in any suitable number and any suitable arrangement. In one or more embodiments, the alignment markers 1404, 1406, 1503, 1505 may be the same as the alignment markers illustrated in FIGS. 3A-3C. In one or more embodiments, the alignment markers 1404, 1406, 1503, 1505 may be pre-formed or pre-placed on the double-ended cable 1400 and the multi-tier PCB 1500. However, in one or more embodiments, the method 1300 may include forming or placing the alignment markers 1404, 1406, 1503, 1505 (e.g., visual indicia) on the cable 1400 and the multi-tier PCB 1500. The markers 1404, 1406, 1503, 1505 may be formed by any suitable process or processes, such as, for example, by laser inscribing the multi-tier PCB 1500 and the first and second heads 1401, 1402 of the double-ended cable 1400.

With reference now to the embodiment illustrated in FIGS. 6 and 7D, the method 1300 also includes a task 1330 of bonding (e.g., flip-chip bonding) the second head 1402 of the double-ended cable 1400 to the first PCB 1501 of the multi-tier PCB 1500. In one or more embodiments, the task 1330 of bonding the second head 1402 of the double-ended cable 1400 to the first PCB 1501 includes lowering the top bonder arm 1601 until the second head 1402 of the double-ended cable 1400 is in contact with the upper surface 1506 of the first PCB 1501. In the illustrated embodiment, the first end effector 1602 is shorter than the second end effector 1603, which enables the top bonder arm 1601 to be lowered in task 1330 without the first end effector 1602 contacting and/or damaging the ribbon cable 1403 of the double-ended cable 1400 (which would otherwise occur if the first end effector 1602 was the same height as the second end effector 1603). The task 1330 of bonding the second head 1402 of the double-ended cable 1400 to the first PCB 1501 may be performed by any suitable process or processes, such as by remelting solder balls on the second head 1402 of the double-ended cable 1400 and/or the first PCB 1501 (e.g., by thermosonic bonding and/or a reflow solder process). The alignment achieved in task 1325 between the alignment marker(s) 1505 on the upper surface 1506 of the first PCB 1501 and the alignment marker(s) 1406 on the lower surface 1407 of the second head 1402 and/or the ribbon cable 1403 of the double-ended cable 1400 is maintained following the task 1330 of bonding the second head 1402 of the double-ended cable 1400 to the first PCB 1501 of the multi-tier PCB 1500.

With reference now to the embodiment illustrated in FIGS. 6 and 7E, the method 1300 also includes a task 1335 of releasing the second head 1402 of the double-ended cable 1400 from the top bonder arm 1601 of the die bonder system 1600 (e.g., by deactivating the second vacuum port 1605 that is in the second end effector 1603).

FIG. 8 is a flowchart illustrating tasks of a method 1900 of bonding a double-ended cable 2000 (which includes a first head 2001, a second head 2002, and polyimide ribbon cables 2003 extending between the first and second heads 2001, 2002) to a multi-tier PCB 2100 according to one embodiment of the present disclosure (e.g., bonding the second head 2002 of the double-ended cable 2000 to a first PCB 2101 of the multi-tier PCB 2100 and bonding the first head 2001 of the double-ended cable 2000 to a second PCB 2102 of the multi-tier PCB 2100 stacked on the first PCB 2101). FIGS. 9A-9E depict a die bonder system 2200 according to one embodiment of the present disclosure performing various tasks illustrated in FIG. 8 for bonding the double-ended cable 2000 to the multi-tier PCB 2100.

With reference now to the embodiment illustrated in FIGS. 8 and 9A, the method 1900 includes a task 1905 of picking up the double-ended cable 2000 utilizing a first top bonder arm 2201 of the die bonder system 2200. In the illustrated embodiment, the top bonder arm 2201 includes a first vacuum port 2202 and a second vacuum port 2203. In one or more embodiments, the first and second vacuum ports 2202, 2203 are independently controllable. In the illustrated embodiment, the task 1905 of picking up the double-ended cable 2000 includes lowering the first top bonder arm 2201 of the die bonder system 2200 until the first top bonder arm 2201 is in contact with or in close proximity to the first and second heads 2001, 2002 of the double-ended cable 2000, and then activating the first vacuum port 2202 and the second vacuum port 2203. Activating the first and second vacuum ports 2202, 2203 causes the first and second heads 2001, 2002 of the double-ended cable 2000 to be suctioned to the first top bonder arm 2201. Additionally, in the illustrated embodiment, the task 1905 of picking up the double-ended cable 2000 includes picking up the double-ended cable 2000 while the double-ended cable 2000 is lying flat (e.g., planar) on a flat (e.g., planar) support surface 2301 of a carrier 2300.

With reference now to the embodiment illustrated in FIGS. 8 and 9B, the method 1900 also includes a task 1910 of aligning the first head 2001 of the double-ended cable 2000 to the second PCB 2102 of the multi-tier PCB 2100. In one or more embodiments, the task 1910 of aligning may be performed by aligning one or more alignment markers or targets 2004 (e.g., visual indicia) on a lower surface 2005 of the first head 2001 and/or the ribbon cable 2003 of the double-ended cable 2000 with one or more alignment markers or targets 2103 (e.g., visual indicia) on an upper surface 2104 of the second PCB 2102 of the multi-tier PCB 2100 utilizing an optical system 2400. The optical system 2400 may be any suitable type or kind of imaging system configured to image the alignment markers 2004, 2103 on the double-ended cable 2000 and the multi-tier PCB 2100. In one or more embodiments, the optical system 2400 may be the same as or similar to the optical system 600 described above with reference to the embodiment depicted in FIGS. 1 and 2A-2I (e.g., the optical system 2400 may be a dual view microscope). In one or more embodiments, the task 1910 of aligning the first head 2001 of the double-ended cable 2000 to the second PCB 2102 of the multi-tier PCB 2100 comprises inserting the optical system 2400 between the first head 2001 of the double-ended cable 2000 and the second PCB 2102 while the double-ended cable 2000 is lifted by the first top bonder arm 2201 of the die bonder system 2200, and imaging, with the optical system 2400, the one or more alignment markers 2103 on the upper surface 2104 of the second PCB 2102 and the one or more alignment markers 2004 on the lower surface 2005 of the first head 2001 and/or the ribbon cable 2003 of the double-ended cable 2000, superimposing the image of the one or more alignment markers 2103 on the upper surface 2104 of the second PCB 2102 on the image of the one or more alignment markers 2004 on the lower surface 2005 of the first head 2001 of the double-ended cable 2000, and moving the first top bonder arm 2201 until the alignment targets 2004, 2103 are aligned with a threshold alignment error, such as approximately (about) 2 µm or less (e.g., approximately (about) 1 µm or less).

Figure 9C:
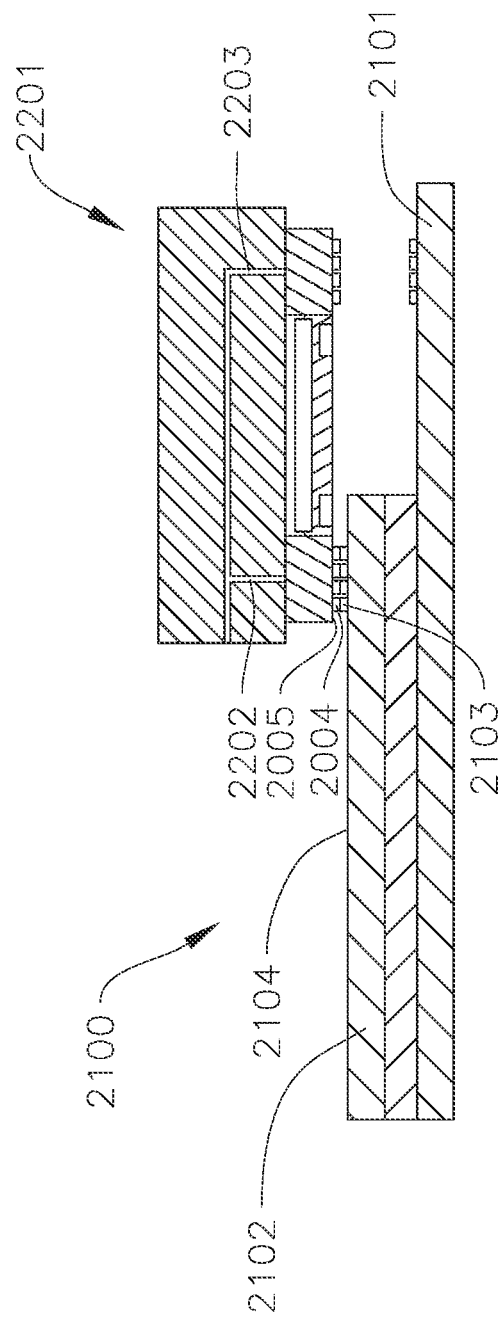

With reference now to the embodiment illustrated in FIGS. 8 and 9C, the method 1900 also includes a task 1915 of bonding (e.g., flip-chip bonding) the first head 2001 of the double-ended cable 2000 to the second PCB 2102 of the multi-tier PCB 2100. In one or more embodiments, the task 1915 of bonding the first head 2001 of the double-ended cable 2000 to the second PCB 2102 includes lowering the first top bonder arm 2201 until the first head 2001 of the double-ended cable 2000 is in contact with the upper surface 2104 of the second PCB 2102. The task 1915 of bonding the first head 2001 of the double-ended cable 2000 to the second PCB 2102 may be performed by any suitable process or processes, such as by remelting solder balls on the first head 2001 of the double-ended cable 2000 and/or the second PCB 2102 (e.g., by thermosonic bonding and/or a reflow solder process). The alignment achieved in task 1910 between the alignment marker(s) 2103 on the upper surface 2104 of the second PCB 2102 and the alignment marker(s) 2004 on the lower surface 2005 of the first head 2001 and/or the ribbon cable 2003 of the double-ended cable 2000 is maintained following the task 1915 of bonding the first head 2001 of the double-ended cable 2000 to the second PCB 2102 of the multi-tier PCB 2100.

Figure 9D:
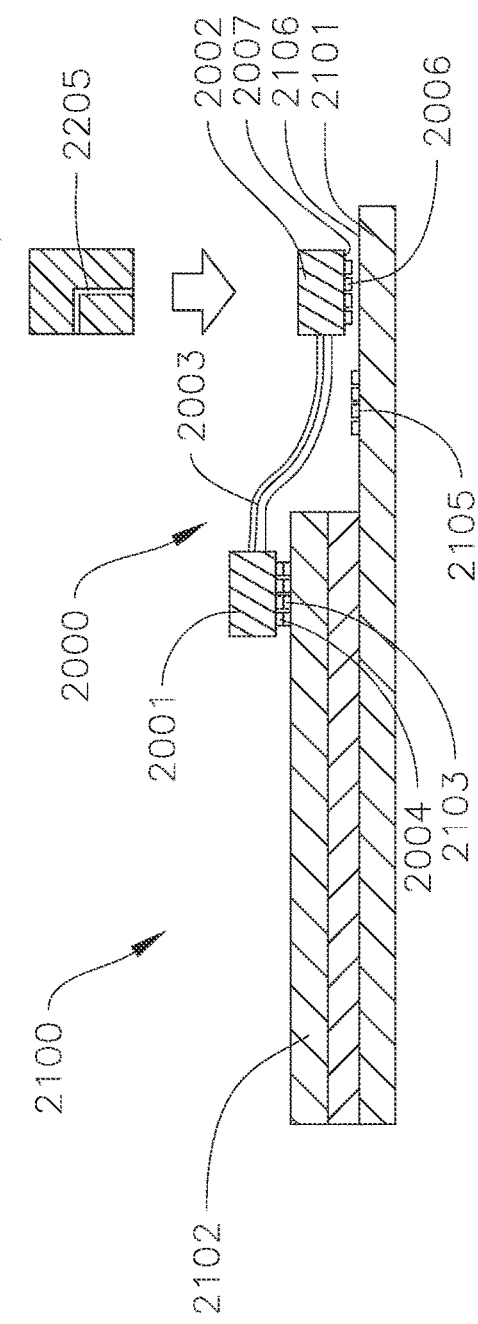

With reference now to the embodiment illustrated in FIGS. 8 and 9D, the method 1900 also includes a task 1920 of releasing the double-ended cable 2000 from the first top bonder arm 2201 of the die bonder system 2200 (e.g., by deactivating the first and second vacuum ports 2202, 2203). As described in more detail below, in the illustrated embodiment, the method 1900 also includes a task of picking up the second head 2002 of the double-ended cable 2000 with a second top bonder arm 2204 having a vacuum port 2205. Additionally, in the illustrated embodiment, the second top bonder arm 2204 includes one or more alignment targets or markers 2206 on a lower surface 2207 of the second top bonder arm 2204, the significance of which is described below. Alternatively, in one or more embodiments in which the first vacuum port 2202 is independent of the second vacuum port 2203, the first vacuum port 2202 of the first top bonder arm 2204 may be utilized to pick up the second head 2002 of the double-ended cable 2000 rather than the second top bonder arm 2204.

In the illustrated embodiment, the method 1900 also includes a task 1925 of calculating or determining the required movements (e.g., the x, y, and z offsets) to align one or more alignment markers or targets 2006 (e.g., visual indicia) on an upper surface 2007 of the second head 2002 and/or the ribbon cable 2003 of the double-ended cable 2000 with one or more alignment markers or targets 2105 (e.g., visual indicia) on an upper surface 2106 of the first PCB 2101 of the multi-tier PCB 2100 utilizing an optical system. In one or more embodiments, the optical system is the same as the optical system 2400 utilized in task 1910. The optical system may be any suitable type or kind of imaging system configured to image the alignment markers 2006, 2105 on the double-ended cable 2000 and the multi-tier PCB 2100. In one or more embodiments, the optical system may be the same as or similar to the optical system described above with reference to the embodiment depicted in FIGS. 1 and 2A-2I (e.g., the optical system may be a dual view microscope). In one or more embodiments, the task 1925 of calculating or determining the required movements to align the second head 2002 of the double-ended cable 2000 to the first PCB 2101 of the multi-tier PCB 2100 includes inserting the optical system 2400 between the second head 2002 of the double-ended cable 2000 and the second top bonder arm 2204, and imaging, with the optical system 2400, one or more alignment markers 2206 on a lower surface 2207 of the second top bonder arm 2204, the one or more alignment markers 2105 on the upper surface 2106 of the first PCB 2101, and the one or more alignment markers 2006 on the upper surface 2007 of the second head 2002 and/or the ribbon cable 2003 of the double-ended cable 2000. In one or more embodiments, the task 1925 also includes superimposing the image of the one or more alignment markers 2206 on the lower surface 2207 of the second top bonder arm 2204 on the image of the one or more alignment markers 2105 on the upper surface 2106 of the first PCB 2101 and on the image of the one or more alignment markers 2006 on the upper surface 2007 of the second head 2002 and/or the ribbon cable 2003 of the double-ended cable 2000, and calculating or determining the required movement(s) of the second top bonder arm 2204 such that the alignment targets (markers) 2206 on the second head 2002 and/or the ribbon cable 2003 of the double-ended cable 2000 are aligned to the alignment targets (markers) 2105 on the first PCB 2101 within a threshold alignment error, such as approximately (about) 2 µm or less (e.g., approximately (about) 1 µm or less). In one or more embodiments, the task 1925 may include imaging the alignment markers 2105 on the first PCB 2101 by temporarily positioning the second head 2002 of the double-ended cable 2000 short of the alignment markers 2105 on the first PCB 2101 (e.g., utilizing a vacuum wand or temporary adhesive to hold the second head 2002 of the double-ended cable 2000 in place on the first PCB 2101) such that the double-ended cable 2000 does not obstruct or obscure the alignment markers 2105 on the first PCB 2101. In one or more embodiments, the task 1925 may include imaging the alignment markers 2105 on the first PCB 2101 by temporarily positioning the second head 2002 of the double-ended cable 2000 past or beyond the alignment markers 2105 on the first PCB 2101 (e.g., utilizing a vacuum wand or temporary adhesive to hold the second head 2002 of the double-ended cable 2000 in place on the first PCB 2101) and utilizing a double-ended cable 2000 having a sufficiently transparent or translucent ribbon cable 2003 such that the optical system 2400 can image the alignment markers 2105 on the first PCB 2101 through the double-ended cable 2000. Temporarily securing the second head 2002 of the double-ended cable 2000 on the first PCB 2101 with the vacuum wand or the temporary adhesive is configured to position the second head 2002 flat or substantially flat (e.g., planar or substantially planar) on the first PCB 2101, which enables imaging by the optical system 2400 and prevents or at least mitigates movement of the second head 2002 during subsequent pickup of the second head 2002 of the double-ended cable 2000. In one or more embodiments, the task 1925 also includes calculating or determining, based on the image(s) captured by the optical system 2400, the distance(s) between the alignment targets 2206 on the second top bonder arm 2204 and the alignment targets 2006 on the second head 2002 of the double-ended cable 2000, and calculating or determining the distance(s) between the alignment targets 2206 on the second top bonder arm 2204 and the alignment targets 2105 on the first PCB 2101 by, for example, adding or subtracting these distances depending on whether the second head 2002 of the double-ended cable 2000 was temporarily positioned short of the alignment markers 2105 on the first PCB 2101 or beyond the alignment markers 2105 on the first PCB 2101.

In the illustrated embodiment, the method 1900 also includes a task 1930 of picking up the second head 2002 of the double-ended cable 2000 with the second top bonder arm 2204 utilizing the vacuum port 2205 (e.g., by lowering the second top bonder arm 2204 of the die bonder system 2200 until the second top bonder arm 2204 is in contact with or in close proximity to the second head 2002 of the double-ended cable 2000 and activating the vacuum port 2205 such that the second head 2002 of the double-ended cable 2000 is suctioned to the second top bonder arm 2104). In the illustrated embodiment, the second top bonder arm 2204 is narrower than the first top bonder arm 2201, which enables the second top bonder arm 2204 to be lowered in task 19300 without contacting the second PCB 2102 (which would otherwise occur if the second top bonder arm 2204 was the same width as the first top bonder arm 2201).

In the illustrated embodiment, the method 1900 also includes a task 1935 of aligning the second head 2002 of the double-ended cable 2000 with the first PCB 2101 of the multi-tier PCB 2100, utilizing the information determined or calculated in task 1925, by moving the second top bonder arm 2104 until the alignment markers 2006, 2105 are aligned with a threshold alignment error, such as approximately (about) 2 µm or less (e.g., approximately (about) 1 µm or less). Additionally, in the illustrated embodiment, the task 1930 of aligning the second head 2002 of the double-ended cable 2000 to the first PCB 2101 of the multi-tier PCB 2100 includes moving the second top bonder arm 2204 toward the second PCB 2102 and the first head 2001 of the double-ended cable 2000 bonded thereon. As described above, in the illustrated embodiment, the second top bonder arm 2204 is narrower than the first top bonder arm 2201, which enables the second top bonder arm 2204 to move toward the second PCB 2102 without contacting the second PCB 2102 (which would otherwise occur if the second top bonder arm 2204 was the same width as the first top bonder arm 2201).

The alignment markers 2004, 2006, 2103, 2105, 2206 may be provided in any suitable number and any suitable arrangement. In one or more embodiments, the alignment markers 2004, 2006, 2103, 2105 may be the same as the alignment markers illustrated in FIGS. 3A-3C. In one or more embodiments, the alignment markers 2004, 2006, 2103, 2105, 2206 may be pre-formed or pre-placed on the double-ended cable 2000, the multi-tier PCB 2100, and the second top bonder arm 2204. However, in one or more embodiments, the method 1900 may include forming or placing the alignment markers 2004, 2006, 2103, 2105, 2206 (e.g., visual indicia) on the cable 2000, the multi-tier PCB 2100, and/or the second top bonder arm 2204. The markers 2004, 2006, 2103, 2105, 2206 may be formed by any suitable process or processes, such as, for example, by laser inscribing the multi-tier PCB 2100, the first and second heads 2001, 2002 of the double-ended cable 2000, and the second top bonder arm 2204.

Figure 9E:
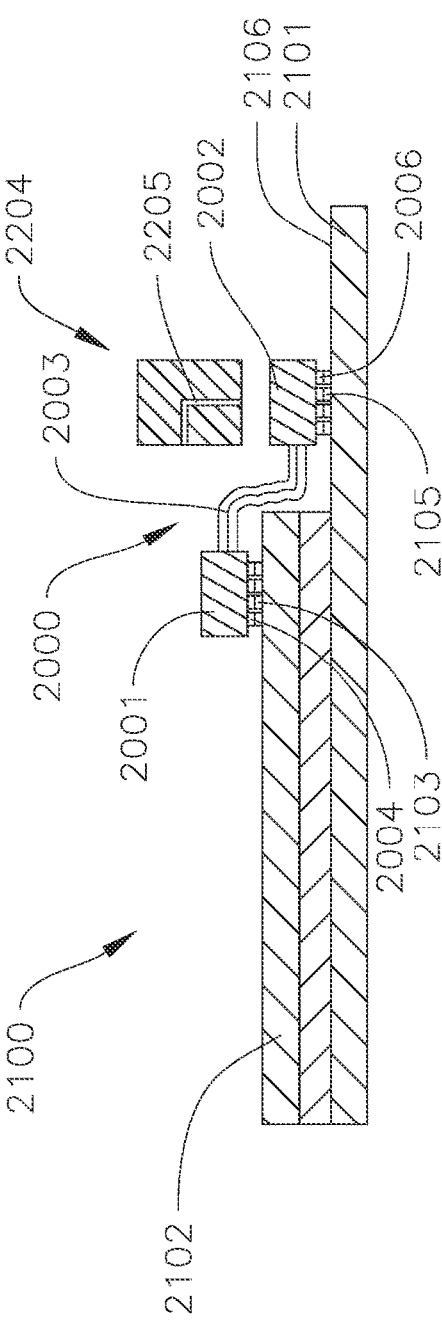

With reference now to the embodiment illustrated in FIGS. 8 and 9E, the method 1900 also includes a task 1940 of bonding (e.g., flip-chip bonding) the second head 2002 of the double-ended cable 2000 to the first PCB 2101 of the multi-tier PCB 2100. In one or more embodiments, the task 1940 of bonding the second head 2002 of the double-ended cable 2000 to the first PCB 2101 includes lowering the second top bonder arm 2204 until the second head 2002 of the double-ended cable 2000 is in contact with the upper surface 2106 of the first PCB 2101. As described above, in the illustrated embodiment, the second top bonder arm 2204 is narrower than the first top bonder arm 2201, which enables the second top bonder arm 2204 to move downward toward the first PCB 2101 without contacting the second PCB 2102 (which would otherwise occur if the second top bonder arm 2204 was the same width as the first top bonder arm 2201). The task 1940 of bonding the second head 2002 of the double-ended cable 2000 to the first PCB 2101 may be performed by any suitable process or processes, such as by remelting solder balls on the second head 2002 of the double-ended cable 2000 and/or the first PCB 2101 (e.g., by thermosonic bonding and/or a reflow solder process). The alignment achieved in task 1935 between the alignment marker(s) 2105 on the upper surface 2106 of the first PCB 2101 and the alignment marker(s) 2006 on the upper surface 2007 of the second head 2002 and/or the ribbon cable 2003 of the double-ended cable 2000 is maintained following the task 1940 of bonding the second head 2002 of the double-ended cable 2000 to the first PCB 2101 of the multi-tier PCB 2100.

With reference now to the embodiment illustrated in FIGS. 8 and 9E, the method 1900 also includes a task 1945 of releasing the second head 2002 of the double-ended cable 2000 from the second top bonder arm 2204 of the die bonder system 2200 (e.g., by deactivating the vacuum port 2205 that is in the second top bonder arm 2204).

Although relative terms such as "outer," "inner," "upper," "lower," and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "about," and similar terms are used as terms of approximation and not as terms of degree, and are intended to account for the inherent deviations in measured or calculated values that would be recognized by those of ordinary skill in the art. Moreover, the tasks described above may be performed in the order described or in any other suitable sequence. Additionally, the methods described above are not limited to the tasks described. Instead, for each embodiment, one or more of the tasks described above may be absent and/or additional tasks may be performed. Furthermore, as used herein, when a component is referred to as being "on" another component, it can be directly on the other component or components may also be present therebetween. Moreover, when a component is component is referred to as being "coupled" to another component, it can be directly attached to the other component or intervening components may be present therebetween.

Also, any numerical range recited herein is intended to include all sub-ranges of the same numerical precision subsumed within the recited range. For example, a range of "2 or less" is intended to include all subranges between (and including) the recited minimum value and the recited maximum value of 2, that is, having a minimum value greater than 0 and a maximum value equal to or less than 2, such as, for example, 1. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The system and/or any other relevant devices or components according to embodiments of the present invention described herein may be implemented utilizing any suitable hardware, firmware (e.g. an application-specific integrated circuit), software, or a combination of software, firmware, and hardware. For example, the various components of the system may be formed on one integrated circuit (IC) chip or on separate IC chips. Further, the various components of the system may be implemented on a flexible printed circuit film, a tape carrier package (TCP), a printed circuit board (PCB), or formed on one substrate. Further, the various components of the system may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A method of bonding a double-ended cable, including a first head, a second head, and a ribbon cable between the first head and the second head, to a multi-tier substrate, including a first substrate and a second substrate stacked on the first substrate, the method comprising:
    picking up, with a top bonder arm of a die bonder system, the double-ended cable;
    imaging, with an optical system, at least one alignment marker on the first head of the double-ended cable, at least one alignment marker on the second substrate of the multi-tier substrate, at least one alignment marker on the second head of the double-ended cable, and at least one alignment marker on the first substrate of the multi-tier substrate;
    aligning, with the top bonder arm, the alignment marker on the first head of the double-ended cable to the alignment marker on the second substrate of the multi-tier substrate within a first alignment error;
    coupling the first head of the double-ended cable to the second substrate;
    releasing the first head of the double-ended cable from the top bonder arm;
    aligning, with the top bonder arm, the alignment marker on the second head of the double-ended cable to the alignment marker on the first substrate of the multi-tier substrate within a second alignment error;
    coupling the second head of the double-ended cable to the first substrate; and
    releasing the second head of the double-ended cable from the top bonder arm.

2. The method of claim 1, wherein the first alignment error is approximately 1 µm or less, and wherein the second alignment error is approximately 2 µm or less.

3. The method of claim 1, wherein the top bonder arm comprises a first end effector and a second end effector.

4. The method of claim 3, wherein the top bonder arm further comprises a temporary spacer on the first end effector, and wherein the method further comprises detaching the temporary spacer from the first end effector before coupling the second head of the double-ended cable to the first substrate.

5. The method of claim 3, wherein a height of first end effector is substantially equal to a height of the second end effector, and wherein the picking up of the double-ended cable comprises picking up the double-ended cable in a planar configuration from a planar support surface.

6. The method of claim 3, wherein the first end effector is shorter than the second end effector, and wherein the picking up of the double-ended cable comprises picking up the double-ended cable in a non-planar configuration from a non-planar support surface.

7. The method of claim 6, wherein a lateral spacing between the first end effector and the second end effector is substantially equal to a length of the ribbon cable in an extended configuration.

8. The method of claim 6, wherein a lateral spacing between the first end effector and the second end effector is less than a length of the ribbon cable in an extended configuration.

9. The method of claim 1, wherein the imaging comprises superimposing an image of the at least one alignment marker on the first head of the double-ended cable on an image of the at least one alignment marker on the second substrate of the multi-tier substrate.

10. The method of claim 1, wherein the imaging comprises:
   imaging a pair of alignment markers on a lower surface of the first head;
   imaging a pair of alignment marks on a portion of the ribbon cable proximate to the first head;
   imaging a first pair and a second pair of alignment markers on an upper surface of the second substrate;
   imaging a pair of alignment markers on a lower surface of the second head;
   imaging a pair of alignment marks on a portion of the ribbon cable proximate to the second head; and
   imaging a first pair and a second pair of alignment markers on an upper surface of the first substrate.

11. A system for bonding a double-ended cable, including a first head, a second head, and a ribbon cable between the first head and the second head, to a multi-tier substrate, including a first substrate and a second substrate stacked on the first substrate, the system comprising:
   a carrier having a support surface configured to support the double-ended cable;
   a top bonder arm of a die bonder system, the top bonder arm comprising a first end effector configured to lift the first head and a second end effector configured to lift the second head of the double-ended cable; and
   an optical system configured to image at least one alignment marker on the first head of the double-ended cable, at least one alignment marker on the second substrate of the multi-tier substrate, at least one alignment marker on the second head of the double-ended cable, and at least one alignment marker on a first substrate of the multi-tier substrate.

12. The system of claim 11, wherein the top bonder arm further comprises a temporary spacer detachably coupled to the first end effector.

13. The system of claim 12, wherein the top bonder arm comprises:
   a first vacuum port in the first end effector;
   a second vacuum port in the first end effector;
   a third vacuum port in the second end effector; and
   a fourth vacuum port in the temporary spacer, the fourth vacuum port in the temporary spacer being aligned with the first vacuum port in the first end effector.

14. The system of claim 11, wherein a height of first end effector is substantially equal to a height of the second end effector, and wherein the support surface is planar.

15. The system of claim 11, wherein the first end effector is shorter in length than the second end effector, and wherein the support surface is non-planar.

16. The system of claim 11, wherein a lateral spacing between the first end effector and the second end effector is substantially equal to a length of the ribbon cable in an extended configuration.

17. The system of claim 11, wherein a lateral spacing between the first end effector and the second end effector is less than a length of the ribbon cable in an extended configuration.

18. The system of claim 11, wherein the optical system comprises a dual view microscope.

19. A method of bonding a double-ended cable, including a first head, a second head, and a ribbon cable between the first head and the second head to a multi-tier substrate including a first substrate and a second substrate stacked on the first substrate, the method comprising:
   picking up, with a first top bonder arm of a die bonder system, the double-ended cable;
   imaging, with an optical system, at least one alignment marker on the first head of the double-ended cable and at least one alignment marker on the second substrate of the multi-tier substrate;
   aligning, with the first top bonder arm, the alignment marker on the first head of the double-ended cable to the alignment marker on the second substrate of the multi-tier substrate;
   coupling the first head of the double-ended cable to the second substrate;
   releasing the first head of the double-ended cable from the first top bonder arm;
   imaging, with the optical system, at least one alignment marker on a second top bonder arm of the die bonder system, at least one alignment marker on the second head of the double-ended cable, and at least one alignment marker on the first substrate of the multi-tier substrate after the coupling of the first head of the double-ended cable to the second substrate;
   picking up, with the second top bonder arm of the die bonder system, the second head of the double-ended cable;
   aligning, with the second top bonder arm of the die bonder system, the alignment marker on the second head of the double-ended cable to the alignment marker on the first substrate of the multi-tier substrate;
   coupling the second head of the double-ended cable to the first substrate; and
   releasing the second head of the double-ended cable from the second top bonder arm.

20. The method of claim 19, further comprising temporarily coupling the second head of the double-ended cable to the first substrate with a vacuum wand or temporary adhesive.

* * * * *